(12) United States Patent
Maeda et al.

(10) Patent No.: US 11,169,452 B2
(45) Date of Patent: Nov. 9, 2021

(54) MEASUREMENT APPARATUS, EXPOSURE APPARATUS, AND METHOD OF MANUFACTURING ARTICLE

(71) Applicant: CANON KABUSHIKI KAISHA, Tokyo (JP)

(72) Inventors: Hironori Maeda, Saitama (JP); Ken Minoda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/751,388

(22) Filed: Jan. 24, 2020

(65) Prior Publication Data
US 2020/0249589 A1 Aug. 6, 2020

(30) Foreign Application Priority Data
Jan. 31, 2019 (JP) .............................. JP2019-015987

(51) Int. Cl.
*G03F 9/00* (2006.01)

(52) U.S. Cl.
CPC .......... *G03F 9/7065* (2013.01); *G03F 9/7046* (2013.01); *G03F 9/7069* (2013.01); *G03F 9/7088* (2013.01)

(58) Field of Classification Search
CPC .... G03F 9/7065; G03F 9/7046; G03F 9/7088; G03F 9/7069; G03F 9/70; G03F 9/7011;
(Continued)

(56) References Cited

U.S. PATENT DOCUMENTS 6,917,421 B1 * 7/2005 Wihl ................. G01B 11/0608
356/237.5
7,580,116 B2 8/2009 Maeda
(Continued)

FOREIGN PATENT DOCUMENTS

JP H09257440 A 10/1997
JP 2002022410 A 1/2002
(Continued)

OTHER PUBLICATIONS

English translation of JP2002-022410, published Jan. 23, 2002. (Year: 2002).*

*Primary Examiner* — Christina A Riddle
(74) *Attorney, Agent, or Firm* — Rossi, Kimms & McDowell LLP

(57) ABSTRACT

The present invention provides a measurement apparatus that measures a position of an object, including an illumination system configured to illuminate the object with illumination light, an image forming system configured to form, on a photoelectric conversion device configured to detect an image of the object, an image of detected light from the object, and a separation system including a reflective polarizer and a λ/4 plate arranged between the illumination system and the image forming system, and configured to separate the illumination light and the detected light via the reflective polarizer and the λ/4 plate, wherein the separation system includes at least one optical member arranged between the reflective polarizer and the λ/4 plate, and each of the illumination system and the image forming system includes a transmission polarizer.

31 Claims, 20 Drawing Sheets

(58) Field of Classification Search
CPC .... G03F 9/7015; G03F 9/7019; G03F 9/7023; G03F 9/7026; G03F 7/70566; G03F 7/70616; G03F 7/70633; G03F 7/70641; G03F 7/70666; G03F 7/70683; G03F 7/70725; G03F 7/70775; G03F 7/70941
USPC ........... 355/52–55, 67–71, 77; 356/399–401, 356/614–624
See application file for complete search history.

(56) References Cited

U.S. PATENT DOCUMENTS

| | | | |
|---|---|---|---|
| 2004/0095573 A1* | 5/2004 | Tsai | G01N 21/9501 356/237.5 |
| 2004/0145734 A1* | 7/2004 | Shibata | G01N 21/956 356/237.5 |
| 2005/0105087 A1* | 5/2005 | Nomura | G03F 7/70566 356/364 |
| 2006/0028706 A1* | 2/2006 | Totzeck | G02B 27/286 359/238 |
| 2006/0158657 A1* | 7/2006 | De Lega | G01B 9/02072 356/497 |
| 2007/0121106 A1* | 5/2007 | Shibata | G01N 21/95607 356/237.2 |
| 2014/0055768 A1* | 2/2014 | Sasaki | G03F 9/7046 355/72 |

FOREIGN PATENT DOCUMENTS

| | | |
|---|---|---|
| JP | 2010133840 A | 6/2010 |
| JP | 5036429 B2 | 9/2012 |

\* cited by examiner

F I G. 10
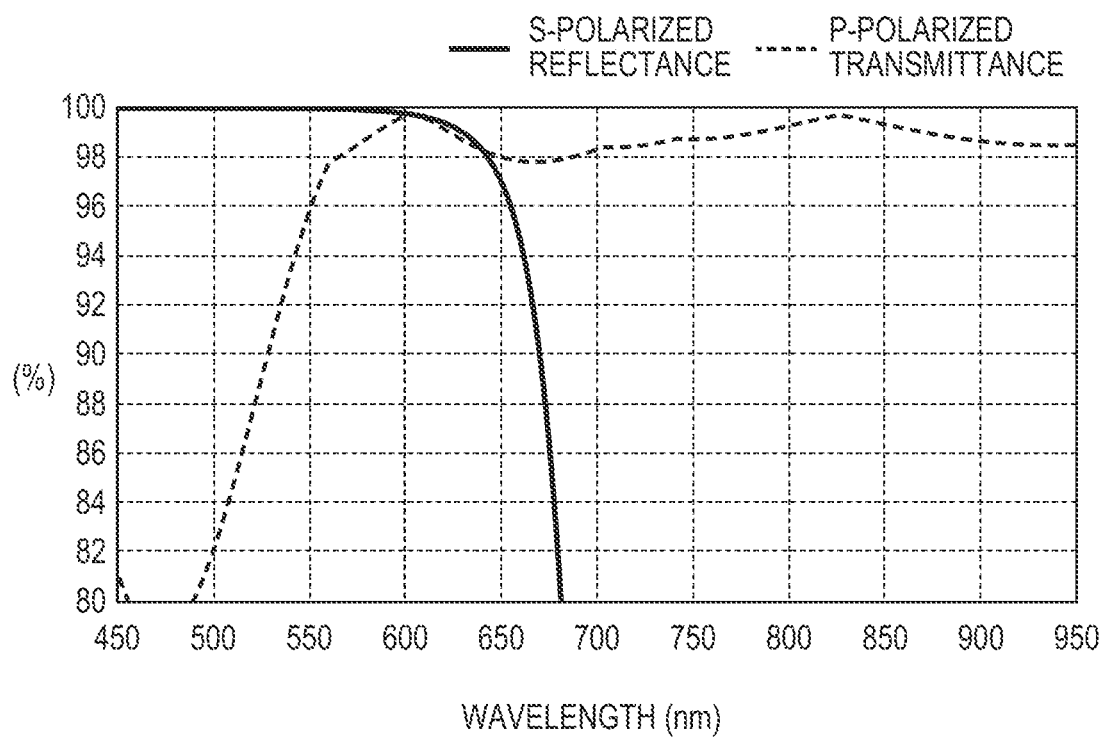
F I G. 11
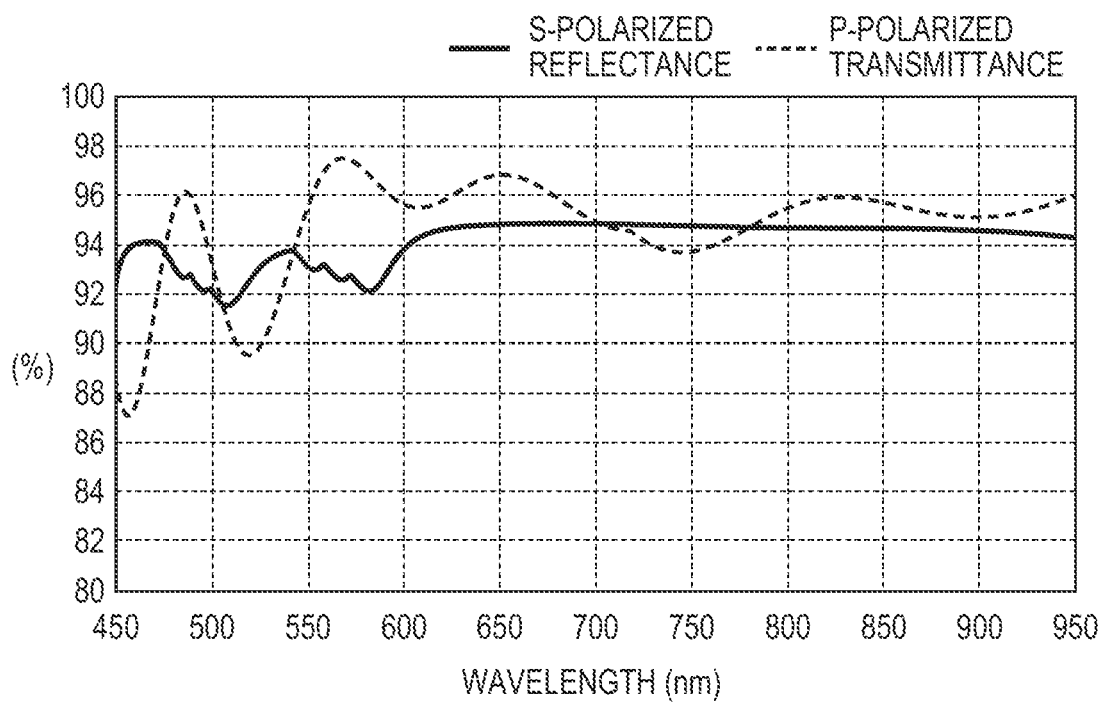

MEASUREMENT APPARATUS, EXPOSURE APPARATUS, AND METHOD OF MANUFACTURING ARTICLE

BACKGROUND OF THE INVENTION

Field of the Invention

The present invention relates to a measurement apparatus, an exposure apparatus, and a method of manufacturing an article.

Description of the Related Art

In recent years, exposure apparatuses used to manufacture semiconductor devices have been required to achieve high overlay accuracy of substrates together with micropatterning. Since about ⅕ of the resolution is generally required for the overlay accuracy, an improvement in overlay accuracy becomes increasingly important as micropatterning of a semiconductor device advances.

To improve the overlay accuracy, a position measurement system needs to be adjusted highly accurately. For example, to reduce false measurement in the position measurement system, Japanese Patent No. 5036429 proposes a technique in which a position measurement system is adjusted with high accuracy by separating a coma aberration and an optical axis shift of the position measurement system.

Widening the wavelength band of light (detection light) for detecting an alignment mark is considered as a means for further improving the overlay accuracy. Especially, in recent years, a process such as a color filter process in which low contrast and low accuracy are obtained with visible light has increased, thereby requiring a position measurement system that can use light of a wide wavelength band including near-infrared light and light (blue wavelength light) having a blue wavelength other than visible light.

However, when the wavelength band of the detection light is widened in a conventional position measurement system, the contrast will degrade, and this will cause, as a result, the degradation of the measurement accuracy and the overlay accuracy. This is due to the fact that the characteristic (film characteristic) of a partial reflecting member such as a polarized beam splitter, which has different reflectances for S-polarized light and P-polarized light, used for synthesizing an illumination optical system and an image forming optical system is not perfect. More specifically, although it is possible to implement a highly accurate polarized beam splitter characteristic when the wavelength band is narrow, a highly accurate polarized beam splitter characteristic cannot be implemented when the wavelength band is widened. As a result, a polarized component that wasn't split by the polarized beam splitter becomes a flare, and the flare degrades the contrast of the position measurement system.

SUMMARY OF THE INVENTION

The present invention provides a measurement apparatus advantageous in the point of measurement accuracy of measuring a position of an object to be detected.

According to one aspect of the present invention, there is provided a measurement apparatus that measures a position of an object to be detected, including an illumination system configured to illuminate the object to be detected with illumination light, an image forming system configured to form, on a photoelectric conversion device configured to detect an image of the object to be detected, an image of detected light from the object to be detected, and a separation system including a reflective polarizer and a λ/4 plate arranged between the illumination system and the image forming system, and configured to separate the illumination light and the detected light via the reflective polarizer and the λ/4 plate, wherein the separation system includes at least one optical member arranged between the reflective polarizer and the λ/4 plate, each of the illumination system and the image forming system includes a transmission polarizer, a reflectance of S-polarized light is higher than a reflectance of P-polarized light in the reflective polarizer, a transmittance of the P-polarized light is higher than a transmittance of the S-polarized light in the transmission polarizer included in the illumination system, and the transmittance of the S-polarized light is higher than the transmittance of the P-polarized light in the transmission polarizer included in the image forming system.

Further aspects of the present invention will become apparent from the following description of exemplary embodiments with reference to the attached drawings.

BRIEF DESCRIPTION OF THE DRAWINGS

FIG. 10 is a graph showing an example of the characteristics of the polarized beam splitter.

FIG. 11 is a graph showing an example of the characteristics of the polarized beam splitter.

DESCRIPTION OF THE EMBODIMENTS

Figure 1:
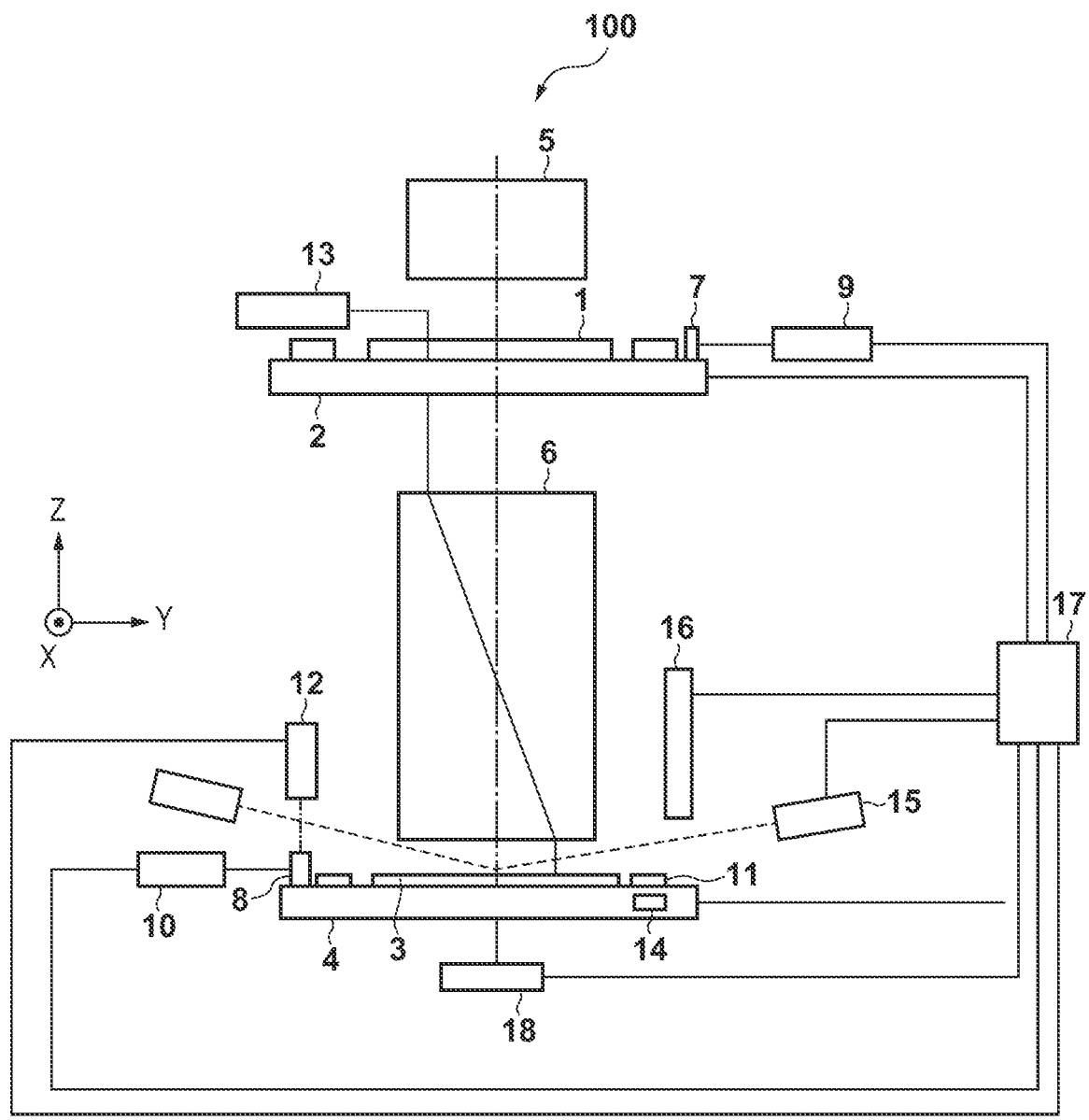
FIG. 1 is a schematic view showing the arrangement of an exposure apparatus as one aspect of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 is a schematic view showing the arrangement of an exposure apparatus 100 as one aspect of the present invention. The exposure apparatus 100 is a lithography apparatus that forms a pattern on a substrate. The exposure apparatus 100 includes a reticle stage 2 that holds a reticle 1 (an original), a substrate stage 4 that holds a substrate 3, and an illumination optical system 5 that illuminates the reticle 1 held by the reticle stage 2. The exposure apparatus 100 also includes a projection optical system 6 that projects (the image of) the pattern of the reticle 1 onto the substrate 3 held by the substrate stage 4, and a control unit 17 that comprehensively controls the overall operation of the exposure apparatus 100.

In this embodiment, the exposure apparatus 100 is a scanning exposure apparatus (scanner) that transfers the pattern of the reticle 1 to the substrate 3 while synchronously scanning the reticle 1 and the substrate 3 in the scanning direction (that is, by a step & scan method). However, the exposure apparatus 100 may be an exposure apparatus (stepper) that transfers the pattern of the reticle 1 onto the substrate 3 while fixing the reticle 1 (that is, by a step & repeat method).

In the following description, a direction (optical axis direction) coincident with the optical axis of the projection optical system 6 will be defined as the Z-axis direction. The scanning direction of the reticle 1 and the substrate 3 in a plane perpendicular to the Z-axis direction will be defined the Y-axis direction. A direction (non-scanning direction) perpendicular to the Z- and Y-axis directions will be defined as the X-axis direction. Directions around the X-, Y-, and Z-axes will be defined as θX, θY, and θZ directions, respectively.

The illumination optical system 5 illuminates the reticle 1, more specifically, a predetermined illumination region on the reticle with light (exposure light) of a uniform illuminance distribution. Examples of the exposure light are the g-ray and i-ray of ultra-high-pressure mercury lamps, a KrF excimer laser, an ArF excimer laser, and an $F_2$ laser. To manufacture a smaller semiconductor device, extreme ultraviolet light (EUV light) of several nm to several hundred nm may be used as the exposure light.

The reticle stage 2 holds the reticle 1, and is configured to be two-dimensionally movable in a plane perpendicular to the optical axis of the projection optical system 6, that is, in the X-Y plane and be rotatable in the θZ direction. A driving device (not shown) such as a linear motor drives the reticle stage 2.

A mirror 7 is arranged on the reticle stage 2. A laser interferometer 9 is arranged at a position corresponding to the mirror 7. The laser interferometer 9 measures the two-dimensional position and rotation angle of the reticle stage 2 in real time, and outputs the measurement result to the control unit 17. The control unit 17 controls the driving device based on the measurement result of the laser interferometer 9, and positions the reticle 1 held by the reticle stage 2.

The projection optical system 6 includes a plurality of optical elements, and projects the pattern of the reticle 1 onto the substrate 3 at a predetermined projection magnification β. In this embodiment, the projection optical system 6 is a reduction optical system having the projection magnification β of, for example, ¼ or ⅕.

The substrate stage 4 includes a Z stage that holds the substrate 3 via a chuck, an X-Y stage that supports the Z stage, and a base that supports the X-Y stage. A driving device (not shown) such as a linear motor drives the substrate stage 4.

A mirror 8 is arranged on the substrate stage 4. Laser interferometers 10 and 12 are arranged at positions facing the mirror 8. The laser interferometer 10 measures positions of the substrate stage 4 in the X-axis direction, Y-axis direction, and θZ direction in real time, and outputs the measurement result to the control unit 17. Similarly, the laser interferometer 12 measures positions of the substrate stage 4 in the Z-axis direction, θX direction, and θY direction in real time, and outputs the measurement result to the control unit 17. The control unit 17 controls the driving device based on the measurement results of the laser interferometers 10 and 12, and positions the substrate 3 held by the substrate stage 4.

A reticle alignment measurement system 13 is arranged near the reticle stage 2. The reticle alignment measurement system 13 detects a reticle reference mark (not shown) provided on the reticle 1 held by the reticle stage 2, and a reference mark 38 provided on a stage reference plate 11 arranged on the substrate stage 4 through the projection optical system 6. The reticle alignment measurement system 13 detects the reticle reference mark provided on the reticle 1, and the reference mark 38 through the projection optical system 6 by using the same light source as that used when actually exposing the substrate 3. More specifically, the reticle alignment measurement system 13 detects, by an image sensor (for example, a photoelectric conversion device such as a CCD camera), light beams reflected by the reticle reference mark and the reference mark 38. The reticle 1 and the substrate 3 are positioned (aligned) based on a detection signal from the image sensor. At this time, when the position and focus are adjusted between the reticle reference mark provided on the reticle 1 and the reference mark 38 provided on the stage reference plate 11, the relative positional relationship (X, Y, and Z) between the reticle 1 and the substrate 3 can be adjusted.

A reticle alignment measurement system 14 is arranged on the substrate stage 4. The reticle alignment measurement system 14 is a transmission measurement system and is used when the reference mark 38 is a transmission mark. The reticle alignment measurement system 14 detects the reticle reference mark provided on the reticle 1 and the reference mark 38 by using the same light source as that used when actually exposing the substrate 3. More specifically, the reticle alignment measurement system 14 detects the transmitted light having passed through the reticle reference mark and the reference mark 38 using a light amount sensor. At this time, the reticle alignment measurement system 14 detects the light amount of the transmitted light while moving the substrate stage 4 in the X-axis direction (or Y-axis direction) and the Z-axis direction. Accordingly, the position and focus can be adjusted between the reticle reference mark provided on the reticle 1 and the reference mark 38 provided on the stage reference plate 11.

In this way, the reticle alignment measurement system 13 or the reticle alignment measurement system 14 can be arbitrarily used to adjust the relative positional relationship (X, Y, and Z) between the reticle 1 and the substrate 3.

The stage reference plate 11 is arranged at the corner of the substrate stage 4 to be almost flush with the surface of the substrate 3 held by the substrate stage 4. The stage reference plate 11 may be arranged at one corner of the substrate stage 4, or the stage reference plates 11 may be arranged at a plurality of corners of the substrate stage 4.

Figure 2:
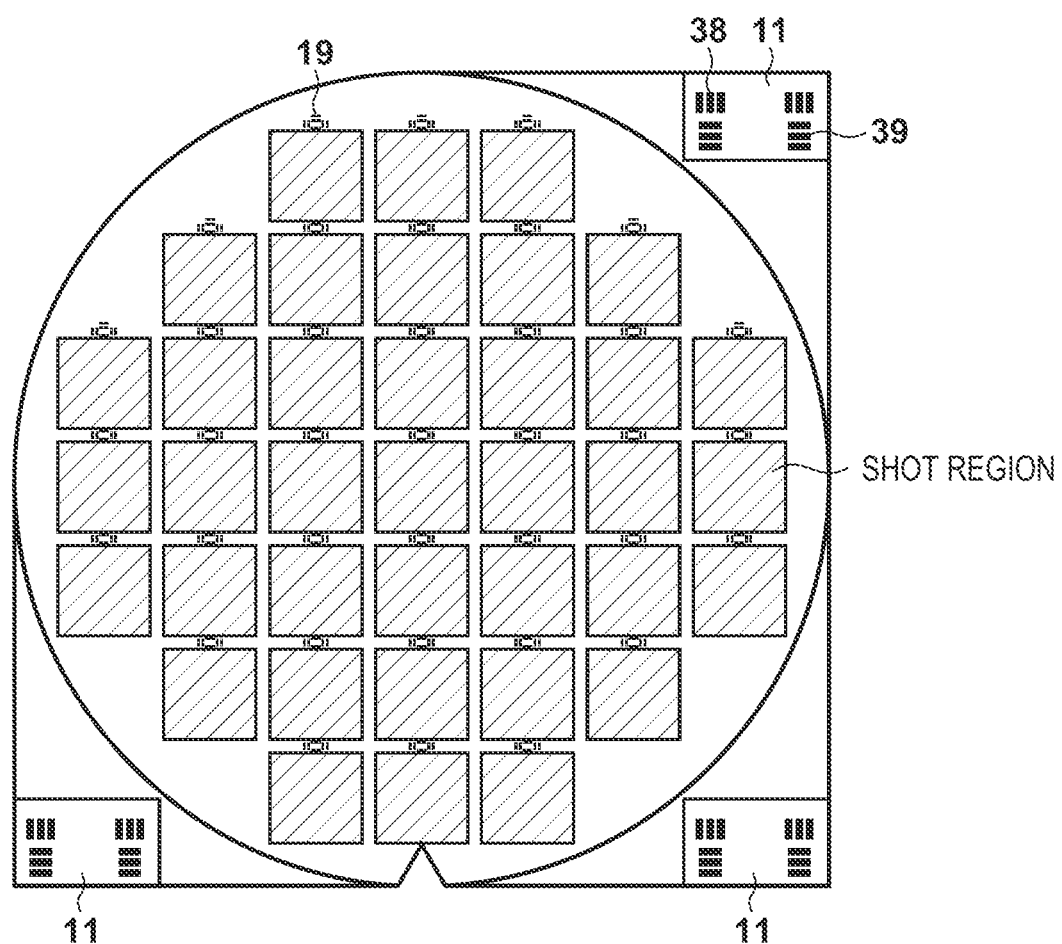
FIG. 2 is a view showing the arrangement of a stage reference plate arranged on a substrate stage.

As shown in FIG. 2, the stage reference plate 11 includes the reference mark 38 that is detected by the reticle alignment measurement system 13 or 14, and a reference mark 39 that is detected by a substrate alignment measurement system 16. The stage reference plate 11 may have a plurality of reference marks 38 and a plurality of reference marks 39. The positional relationship (X- and Y-axis directions) between the reference marks 38 and 39 is set to a predetermined one (that is, is known). Note that the reference marks 38 and 39 may be common marks.

A focus measurement system 15 includes a projection system that obliquely projects light onto the surface of the substrate 3, and a light receiving system that receives light reflected by the surface of the substrate 3. The focus measurement system 15 measures a position of the substrate 3 in the Z-axis direction, and outputs the measurement result to the control unit 17. The control unit 17 controls, based on the measurement result of the focus measurement system 15, the driving device that drives the substrate stage 4, and adjusts a position of the substrate 3 in the Z-axis direction and the inclination angle of the substrate 3 held by the substrate stage 4.

The substrate alignment measurement system 16 includes an illumination system IL and an image forming system IM. The illumination system IL illuminates an alignment mark 19 provided on the substrate 3 and the reference mark 39 provided on the stage reference plate 11 with light (illumination light). The image forming system IM forms images on the photoelectric conversion device that detects images of light (detection light) from the alignment mark 19 provided on the substrate 3 and the reference mark 39 provided on the stage reference plate 11. The substrate alignment measurement system 16 measures the position of the alignment mark 19 and that of the reference mark 39, and outputs the measurement result to the control unit 17. The control unit 17 controls, based on the measurement result of the substrate alignment measurement system 16, the driving device that drives the substrate stage 4, and adjusts positions of the substrate 3 in the X- and Y-axis directions that is held by the substrate stage 4.

In general, the arrangement of the substrate alignment measurement system is roughly divided into two: an off-axis alignment (OA) measurement system and a TTL (Through The Lens alignment) measurement system. The OA measurement system optically detects an alignment mark provided on a substrate without the intervention of a projection optical system. The TTL measurement system detects an alignment mark provided on a substrate through a projection optical system by using light (non-exposure light) different in wavelength from exposure light. Although the substrate alignment measurement system 16 is the OA measurement system in this embodiment, the present invention does not limit the alignment detection method. For example, when the substrate alignment measurement system 16 is the TTL measurement system, it detects the alignment mark provided on the substrate through the projection optical system 6. Except this, the basic arrangement is the same as that of the OA measurement system.

The control unit 17 is formed by, for example, a computer including a CPU and a memory, and comprehensively controls the respective units of the exposure apparatus 100 according to a program stored in a storage unit. The control unit 17 controls exposure processing of transferring the pattern of the reticle 1 to the substrate 3, that is, exposing the substrate 3. In the exposure processing, the control unit 17 controls the position of the substrate 4 based on, for example, the measurement result of the substrate alignment measurement system 16.

Figure 3:
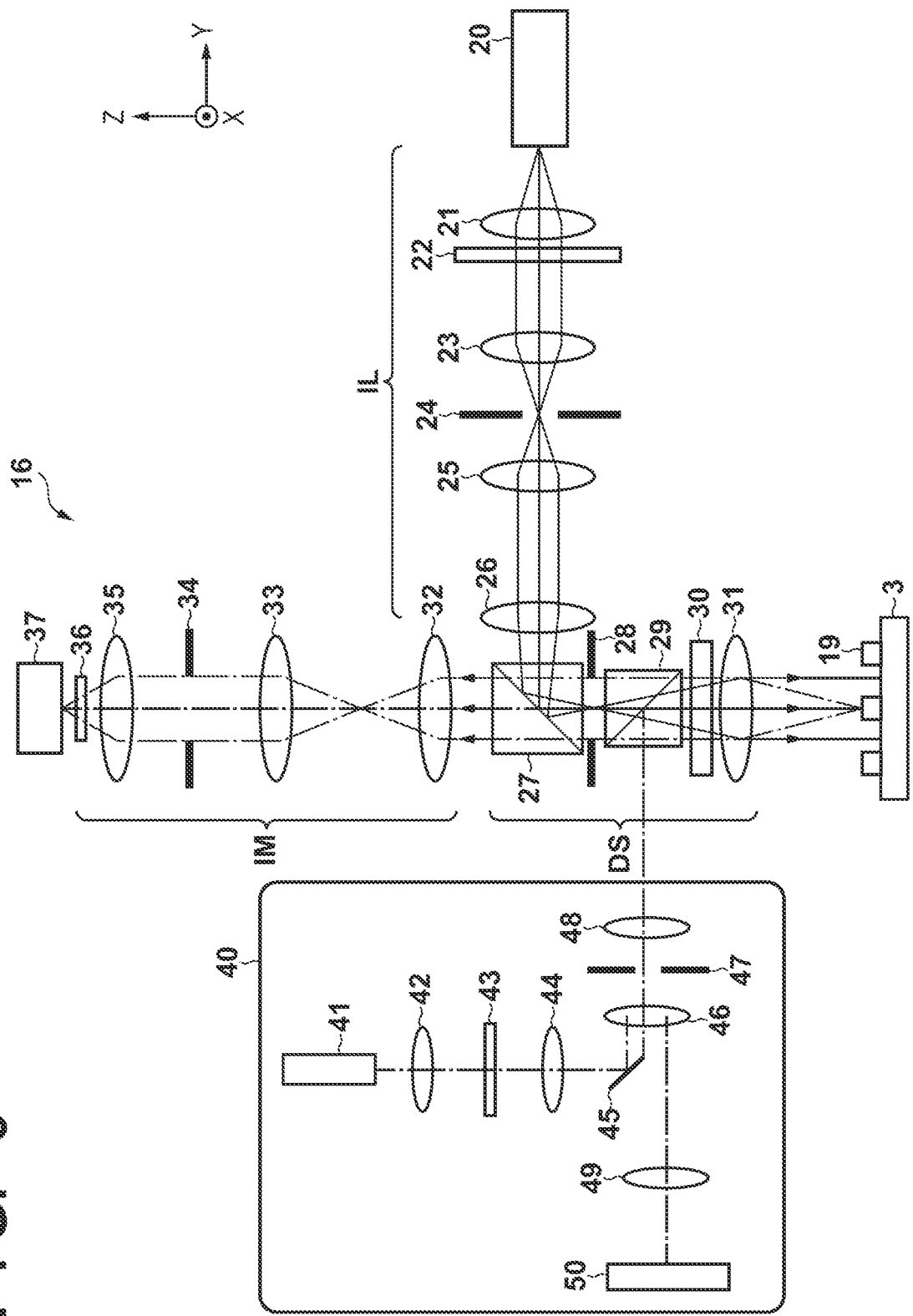
FIG. 3 is a schematic view showing the detailed arrangement of a substrate alignment measurement system.

The substrate alignment measurement system 16 will be described in detail with reference to FIG. 3. FIG. 3 is a schematic view showing the detailed arrangement of the substrate alignment measurement system 16. The substrate alignment measurement system 16 functions as a measurement system that measures the position of the substrate 3 by detecting the alignment mark 19 provided on the substrate 3 as an object to be detected.

The substrate alignment measurement system 16 includes a light source 20, a first capacitor optical system 21, the wavelength filter plate 22, a second capacitor optical system 23, an aperture stop plate 24, a first illumination system 25, a second illumination system 26, a polarized beam splitter 27, and an NA stop 28. Furthermore, the substrate alignment measurement system 16 includes an AF prism 29, a λ/4 plate 30, an objective lens 31, a relay lens 32, a first image forming system 33, an aperture stop 34, a second image forming system 35, a wavelength shift difference adjustment optical member 36, and a photoelectric conversion device 37.

In this embodiment, the first capacitor optical system 21, the wavelength filter plate 22, the second capacitor optical system 23, the aperture stop plate 24, the first illumination system 25, and the second illumination system 26 form the illumination system IL. The relay lens 32, the first image forming system 33, the aperture stop 34, the second image forming system 35, and the wavelength shift difference adjustment optical member 36 form the image forming system IM. In addition, the polarized beam splitter 27 arranged between the illumination system IL and the image forming system IM, the NA stop 28, the AF prism 29, the λ/4 plate 30, and the objective lens 31 form a separation system DS. The separation system DS is an optical system that synthesizes the illumination system IL and the image forming system IM. In this embodiment, the separation system DS has a function of separating the illumination light and the detection light.

The light source 20 emits, as (outputs) light (illumination light) for illuminating the alignment mark 19, light having a wavelength bandwidth equal to or more than 300 nm. In this embodiment, the light source 20 emits visible light (for example, light having a wavelength of 500 nm (inclusive) to 700 nm (inclusive)), blue wavelength light (for example, light (blue wavelength light) having a wavelength of 450 nm (inclusive) to 550 nm (inclusive)), and infrared light (for example, light having a wavelength of 700 nm (inclusive) to 1,500 nm (inclusive)). The light (illumination light) emitted from the light source 20 passes through the first capacitor optical system 21, the wavelength filter plate 22, and the second capacitor optical system 23, and reaches the aperture stop plate 24 located on the pupil plane (optical Fourier transform plane with respect to the object plane) of the substrate alignment measurement system 16.

The wavelength filter plate 22 is arranged on the optical path between the light source 20 and the photoelectric conversion device 37. A plurality of wavelength filters that pass light beams whose wavelength bands are different from each other are arranged on the wavelength filter plate 22. One wavelength filter is selected from the plurality of wavelength filters under the control of the control unit 17, and is arranged on the optical path of the substrate alignment measurement system 16.). In this embodiment, on the wavelength filter plate 22, a wavelength filter that passes infrared light (light of a red wavelength band), a wavelength filter that passes visible light (light of a blue wavelength band), and a wavelength filter that passes blue wavelength light are arranged. On the wavelength filter plate 22, by switching among the wavelength filters, it is possible to select the wavelength band of the light for illuminating the alignment mark 19 provided on the substrate 3. Furthermore, the wavelength filter plate 22 may have an arrangement in which a new wavelength filter can be added in addition to the plurality of wavelength filters provided in advance.

The aperture stop plate 24 includes a plurality of aperture stops different in illumination σ. The aperture stop plate 24 can change the illumination a of the light for illuminating the alignment mark 19 by switching an aperture stop to be arranged on the optical path of the substrate alignment measurement system 16 under the control of the control unit 17. The aperture stop plate 24 may have an arrangement in which a new aperture stop can be added in addition to the plurality of aperture stops provided in advance.

Light that has reached the aperture stop plate 24 is guided to the polarized beam splitter 27 through the first illumination system 25 and the second illumination system 26. Of the light guided to the polarized beam splitter 27, S-polarized light perpendicular to the paper surface of the drawing is reflected by the polarized beam splitter 27, passes through the NA stop 28, the AF prism 29, and the λ/4 plate 30, and is converted into circularly polarized light. The light that passed through the λ/4 plate 30 illuminates, via the objective lens 31 the alignment mark 19 provided on the substrate 3. The NA of the NA stop 28 can be changed by changing the aperture value under the control of the control unit 17.

Light beams (detection light) reflected, diffracted, and scattered by the alignment mark 19 pass through the objective lens 31, are transmitted through the λ/4 plate 30, and are converted into P-polarized light parallel to the paper surface of the drawing. The P-polarized light is transmitted through the polarized beam splitter 27 via the NA stop 28. The light transmitted through the polarized beam splitter 27 reaches the photoelectric conversion device (for example, an image sensor such as a CCD image sensor) 37 through the relay lens 32, the first image forming system 33, the aperture stop 34, the second image forming system 35, and the wavelength shift difference adjustment optical member 36. The light that reaches the photoelectric conversion device 37 forms an image of the alignment mark 19 on the photoelectric conversion device, and the photoelectric conversion device 37 detects the formed image. The photoelectric conversion device 37 detects the light from the alignment mark 19, and can extend an accumulation time until the intensity of the light exceeds a predetermined threshold. The control unit 17 controls the accumulation time of the photoelectric conversion device 37. Furthermore, the control unit 17 obtains the position of the substrate 3 based on an output signal (a signal corresponding to the image of the alignment mark 19 formed on the photoelectric conversion device) from the photoelectric conversion device 37.

Figure 4:
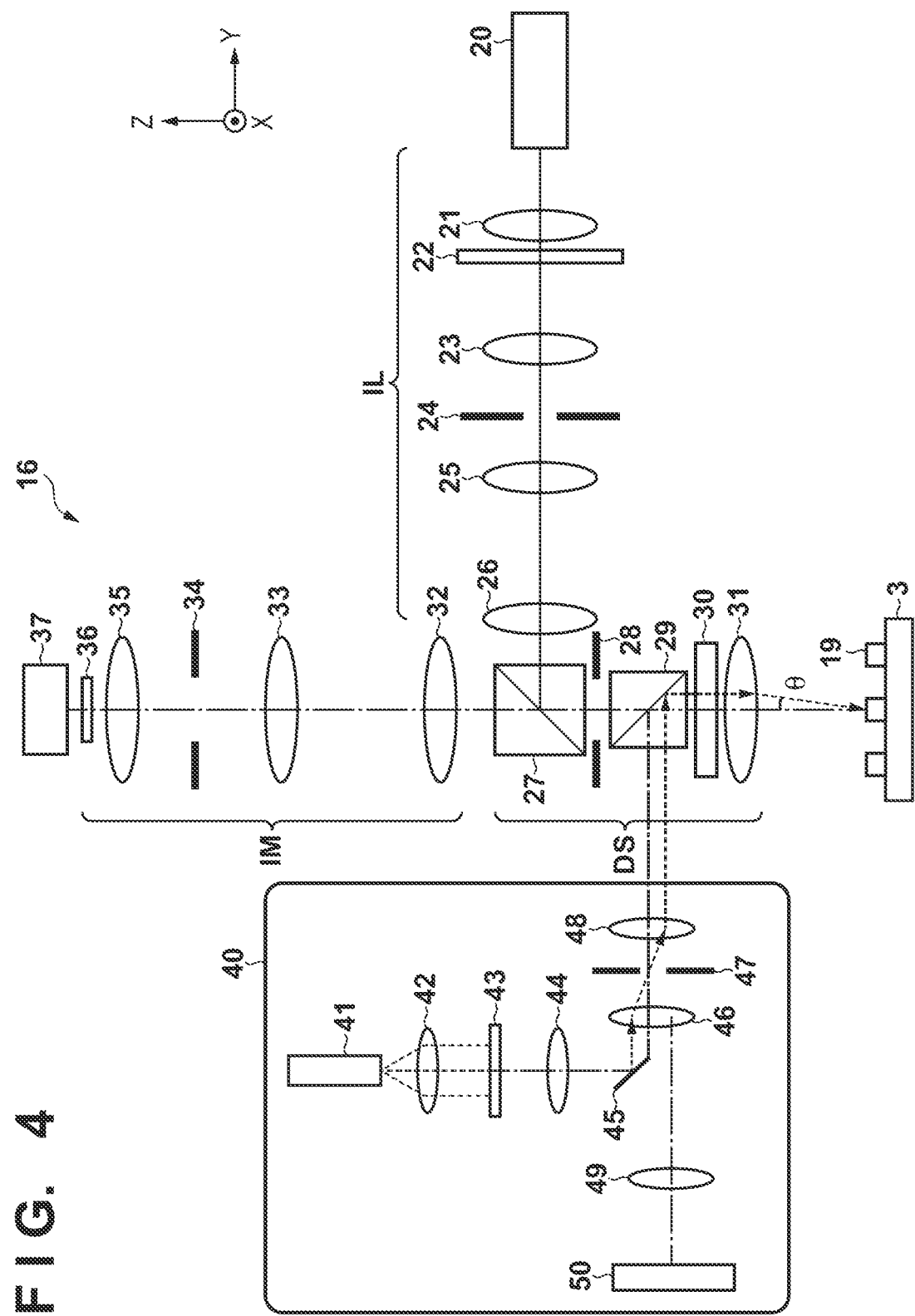
FIG. 4 is a view for explaining an AF measurement system in detail.
Figure 5:
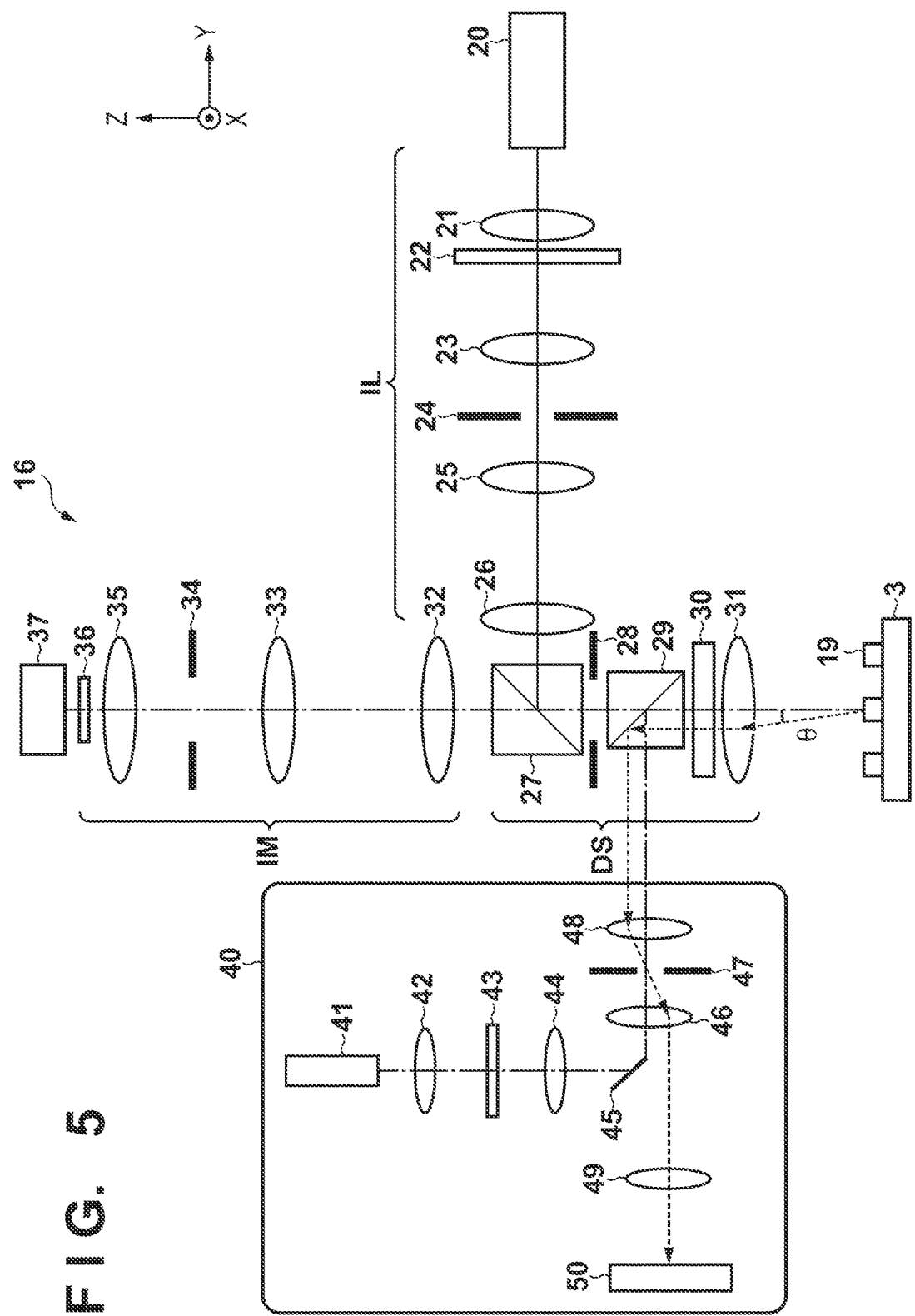
FIG. 5 is a view for explaining the AF measurement system in detail.

In addition, the substrate alignment measurement system 16 includes a focus measurement system (AF measurement system) 40 for substrate alignment measurement. The AF measurement system 40 will be described in detail with reference to FIGS. 4 and 5. FIGS. 4 and 5 show a state in which the AF measurement system 40 is performing focus measurement. More specifically, FIG. 4 shows a state in which the AF measurement system 40 has emitted focus measurement light (AF light) to the substrate 3, and FIG. 5 shows a state in which the AF measurement system 40 has received the AF light reflected by the substrate 3.

Referring to FIG. 4, the AF light emitted from an AF light source 41 illuminates an AF measurement pattern 43 by Köhler illumination through a lens 42. The AF light source 41 emits, as AF light, light of a wavelength not used for substrate alignment, and the AF light is reflected by the AF prism 29. The AF prism 29 is formed by a dichroic prism in this embodiment. The AF measurement pattern 43 is formed by drawing a slit pattern on a glass substrate. The AF light that passed through the slit pattern of the AF measurement pattern 43 is reflected by a mirror 45 through a lens 44 and reaches a lens 46. At this time, the AF light will reach not the center of the lens 46 but a portion offset from the center of the lens 46, be refracted by the lens 46 to pass a reference mirror 47, and reach a lens 48. The AF light that reached the lens 48 also will also reach not the center of the lens 48 but a portion offset from the center of the lens 48 in a similar manner. Note that in FIG. 4, although only the principal ray of the AF light is shown in stages after the AF measurement pattern 43, the AF light is actually rays that have an NA.

The AF light that reached the lens 48 is refracted by the lens 48 and reaches the AF prism 29. The AF prism 29 is formed by a prism that has a characteristic of reflecting the AF light from the AF light source 41 and transmitting the light from the light source 20. The AF light reflected by the AF prism 29 is transmitted through the λ/4 plate 30 and reaches the objective lens 31. At this time, the AF light reaches, instead of the center of the objective lens 31, a portion offset from the center of the objective lens 31, is refracted by the objective lens 31, and enters (obliquely enters) the substrate 3 at an angle θ as shown in FIG. 4.

Referring to FIG. 5, the AF light that entered the substrate 3 is reflected by the angle θ and reaches the objective lens 31. At this time, the AF light reaches, instead of the center of the objective lens 31, a portion offset from the center of the objective lens 31, is transmitted through the λ/4 plate 30 upon being refracted by the objective lens 31, and reaches the AF prism 29. Note that although only the principal ray of the AF light is shown in FIG. 5, the AF light is actually rays that have an NA.

The AF light reflected by the AF prism 29 reaches the lens 48. At this time, the AF light reaches, instead of the center of the lens 48, a portion offset from the center of the lens 48, passes through the reference mirror 47 upon being refracted by the lens 48, and reaches the lens 46. At this time, the AF light reaches, instead of the center of the lens 46, a portion offset from the center of the lens 46, is refracted by the lens 46, and reaches the center of a lens 49. The AF light that reached the lens 49 passes through the lens 49 and is received by an AF sensor 50.

This embodiment described a case in which the AF light is obliquely projected to the substrate 3 and the AF light reflected by the substrate 3 is received by the AF sensor 50 in the AF measurement system 40. In this case, it can be seen that the AF light received by the AF sensor 50 will shift (deviate) in accordance with the movement of the substrate 3 in the Z-axis direction (focus direction). In this manner, the AF measurement system 40 can perform focus measurement of the substrate 3 by obliquely illuminating the substrate 3.

When the substrate alignment measurement system 16 detects the alignment mark 19 provided on the substrate 3, monochromatic light or light of a narrow wavelength band generates interference fringes because a resist (transparent layer) is applied (formed) on the alignment mark 19. Thus, a signal of the interference fringes is added to an alignment signal from the photoelectric conversion device 37, and the alignment mark 19 cannot be detected with high accuracy. In general, a light source that emits light of a wide wavelength band is used as the light source 20 to reduce the addition of a signal of interference fringes to an alignment signal from the photoelectric conversion device 37.

Figure 6:
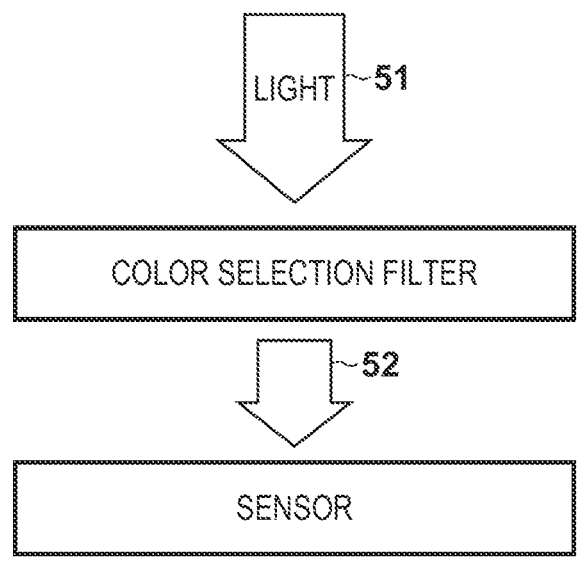
FIG. 6 is a view for explaining a color filter.

As described above, the substrate alignment measurement system 16 uses light of a wide wavelength band to reduce interference fringes caused by a resist. In recent years, however, a process (color filter process) of handling a color filter that passes only light of a specific wavelength has increased. The color filter is a color selection filter arranged on a sensor such as a CCD image sensor or a CMOS image sensor, as shown in FIG. 6. By making the light pass through the color filter, the pixels of the sensor can hold color information. More specifically, as shown in FIG. 6, when light 51 of a broad wavelength enters the color filter, only light 52 that can pass through the color filter will reach the sensor, and thus the pixels of the sensor can hold color information.

Figure 7:
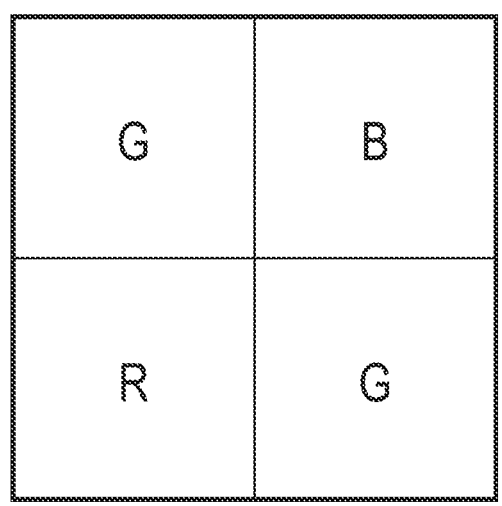
FIG. 7 is a view showing an RGB color filter.

For example, in the RGB color filter process, as shown in FIG. 7, color filters that pass red wavelength (R) light, green wavelength (G) light, and blue wavelength (B) light, respectively, are arranged parallelly on the sensor. In device manufacturing in the RGB color filter process, alignment needs to be performed via each color filter, and it is thus necessary to switch the wavelength band widely from the blue wavelength to the red wavelength.

Figure 8:
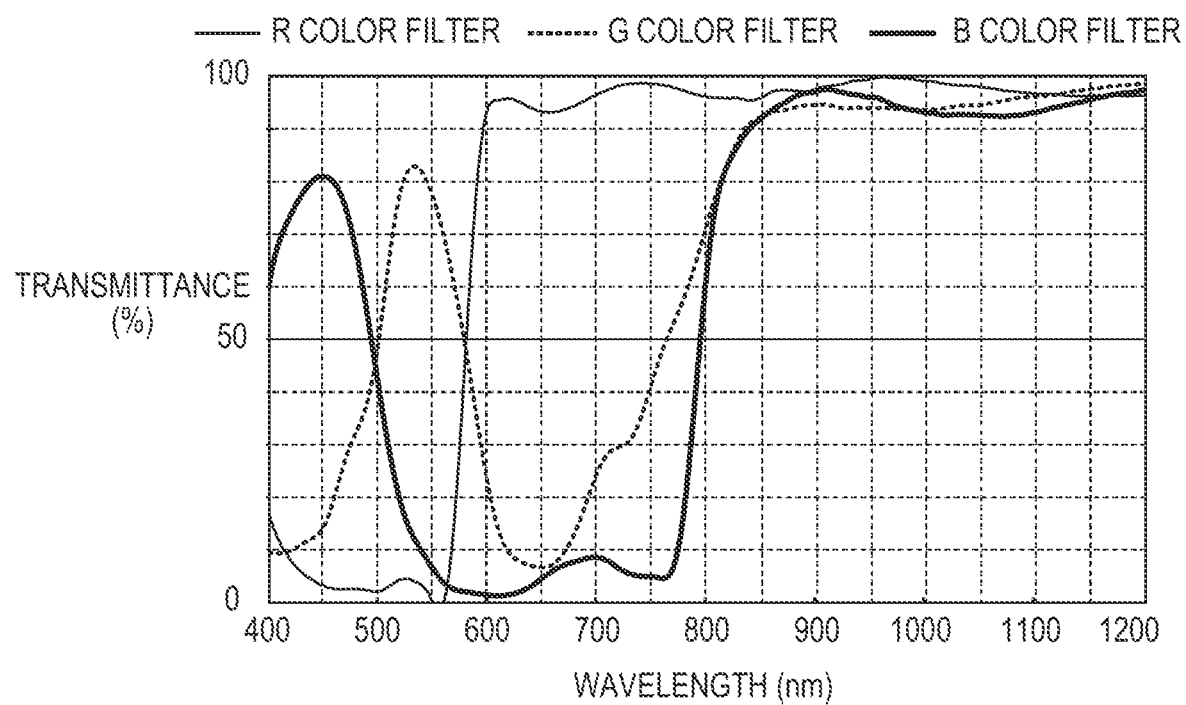
FIG. 8 is a graph showing an example of the transmittances of the RGB color filter.

FIG. 8 is a graph showing examples of the transmittances of the RGB color filters. In FIG. 8, the abscissa represents the wavelength [nm] and the ordinate represents the transmittance [%]. Referring to FIG. 8, the R color filter has a high transmittance for light having a wavelength of 600 nm or more but hardly transmits light having a wavelength less than 550 nm. Therefore, to perform alignment via the R color filter, it is necessary to use light having a wavelength of 600 nm or more. The G color filter has the peak of the transmittance near a wavelength of 530 nm. Therefore, to perform alignment via the G color filter, it is necessary to use light having a wavelength near 530 nm or light having a wavelength of 850 nm or more. Furthermore, the B color filter has the peak of the transmittance near a wavelength of 450 nm. Therefore, to perform alignment via the B color filter, it is necessary to use light having a wavelength near 450 nm or light having a wavelength of 850 nm or more.

As described above, in the RGB color filter process, it is necessary to perform alignment using light having a wavelength that is transmitted through each color filter or light having a wavelength of 850 nm or more that is transmitted through all the color filters. Thus, it is possible to consider using only light which has a wavelength of 850 nm or more and can be transmitted through all the color filters, that is, infrared light. However, in the actual process, since various layers are overlaid in addition to the color filters, it may be impossible to obtain contrast using only the infrared light depending on interference conditions. Therefore, in the RGB color filter process, it is important to perform alignment by selecting light having a wavelength that is transmitted through the color filters and makes it possible to obtain contrast.

As a result of diligent consideration by the present inventor, it has been found that, in order to perform highly accurate alignment, it is necessary to use light having a wavelength near 800 nm for the R color filter and the G color filter while using light having a wavelength near 450 nm for the B color filter. Hence, in the RGB color filter process, it is necessary to implement an alignment measurement system that can use light having a wide wavelength equal to 300 nm or more, more specifically, an alignment system that can use wide wavelength light including blue wavelength light and infrared light other than visible light.

Figure 9:
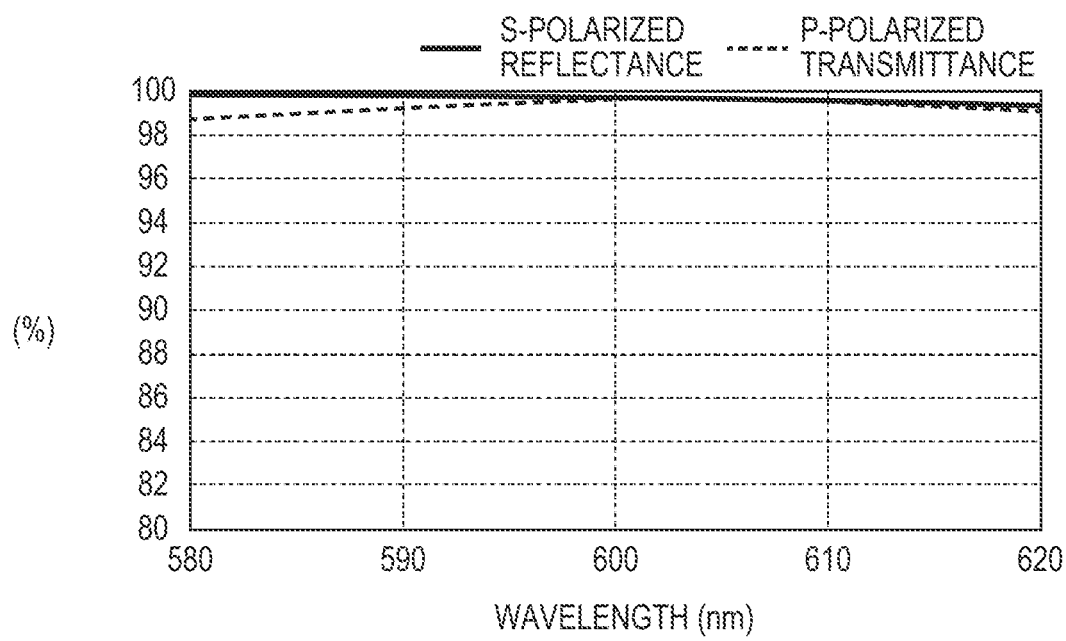
FIG. 9 is a graph showing an example of the characteristics of a polarized beam splitter.

FIG. 9 is a graph showing an example of the characteristics of a polarized beam splitter used as the polarized beam splitter 27 in a conventional technique. FIG. 9 shows the S-polarized reflectance (the reflectance of S-polarized light) and the P-polarized transmittance (the transmittance of P-polarized light) of the polarized beam splitter with respect to light having a wavelength of 580 nm (inclusive) to 620 nm (inclusive). Also, in FIG. 9, the abscissa represents the wavelength [nm] and the ordinate represents the reflectance and the transmittance [%]. Referring to FIG. 9, in a case in which the width of the wavelength band is narrow such as a wavelength between 580 nm (inclusive) to 620 nm (inclusive), more specifically, the width of the wavelength band is about 40 nm, both the S-polarized reflectance and the P-polarized transmittance will be 98% or more. In this case, the polarized beam splitter can separate (split) the S-polarized light and the P-polarized light with very high accuracy.

FIG. 10 is a graph showing an example of the characteristics, more specifically, the S-polarized reflectance and the P-polarized transmittance of the polarized beam splitter shown in FIG. 9 with respect to light having a wavelength of 450 nm (inclusive) to 950 nm (inclusive). In FIG. 10, the abscissa represents the wavelength [nm] and the ordinate represents the reflectance and the transmittance [%]. Referring to FIG. 10, in a case in which the width of the wavelength band is wide such as a wavelength between 450 nm (inclusive) and 950 nm (inclusive), the S-polarized reflectance will rapidly decrease on the side of a wavelength equal to 650 nm or more, and the P-polarized transmittance will rapidly decrease on the side of a wavelength equal to 550 nm or less. Since a polarized beam splitter 27 designed (optimized) for a narrow wavelength band such as a wavelength between 580 nm (inclusive) and 620 nm (inclusive) is used in this case, it is shown that the S-polarized light and the P-polarized light cannot be separated in a wavelength band which falls outside of this range.

In recent years, as described above, it has become increasingly necessary to use wide wavelength light, which includes blue wavelength light and infrared light other than visible light, in alignment. However, as shown in FIG. 10, a polarized beam splitter optimized for a narrow wavelength band cannot be used for blue wavelength light and infrared light.

Thus, a polarized beam splitter designed (optimized) for a wide wavelength band including lights of blue wavelengths and infrared wavelengths needs to be used. FIG. 11 is a view showing an example of the characteristics of a polarized beam splitter designed for a wide wavelength band of 450 nm (inclusive) to 950 (inclusive). In FIG. 11, the abscissa represents the wavelength [nm] and the ordinate represents the reflectance and the transmittance [%]. Referring to FIG. 11, it can be seen that the rapid decrease of the S-polarized reflectance on the side of a long wavelength equal to 650 nm or more and the rapid decrease of the P-polarized transmittance on the side of a wavelength equal to 550 nm or less which were observed in FIG. 10 have disappeared, and that the S-polarized light is reflected and the P-polarized light is transmitted in the wide wavelength band. On the other hand, the S-polarized reflectance and the P-polarized transmittance which were equal to or more than 98% in a wavelength band of 580 nm (inclusive) to 620 nm (inclusive) have greatly decreased to nearly 95%. This is because it becomes more difficult to bring the S-polarized reflectance and the P-polarized transmittance closer to 100% when (the film design of) the polarized beam splitter is designed for a wide wavelength band. In this manner, there is a trade-off between broad wavelength characteristics (film characteristics) and the absolute values of the S-polarized reflectance and the P-polarized transmittance. In general, the number of film layers need to be increased to implement broad wavelength characteristics, and this tends to decrease the absolute values of the S-polarized reflectance and the P-polarized transmittance because film absorption will increase due to the increase in the film layers or light amount loss will occur due to interference in the multilayer film. In addition, as shown in FIG. 11, it can be observed that a periodic wave-like component has appeared in the P-polarized transmittance. This component is a phenomenon that occurs due to the increase in the film layer count.

Figure 12:
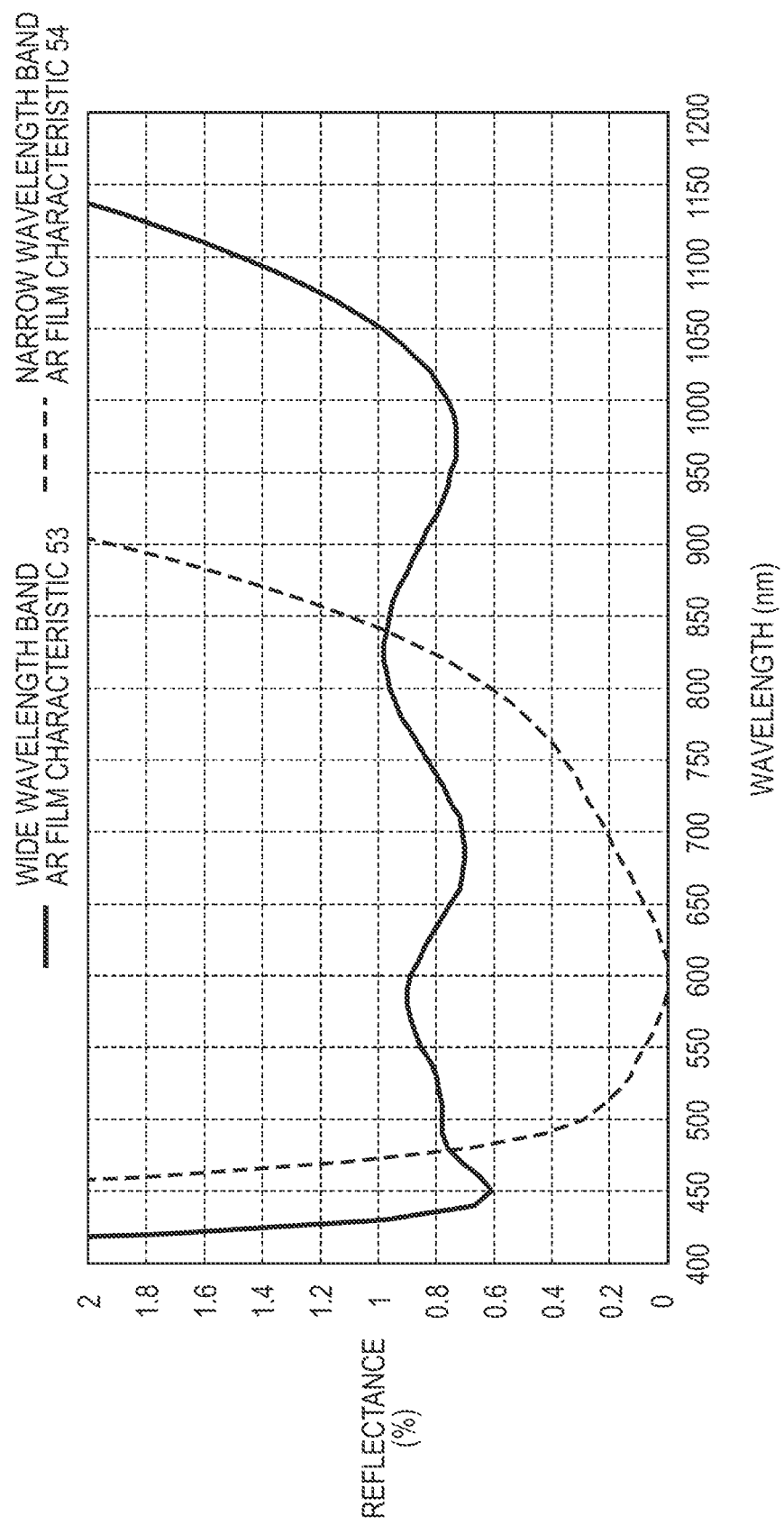
FIG. 12 is a graph showing an example of the characteristics of an anti-reflection film.

Phenomena such as the reduction in the absolute values of the S-polarized reflectance and the P-polarized transmittance and the appearance of a periodic wave can also occur in optical members other than the polarized beam splitter. FIG. 12 is a graph showing an example of the characteristics of an anti-reflection film (AR (Anti Reflection) film) used in an optical member such as a lens or the like. In FIG. 12, the abscissa represents the wavelength [nm] and the ordinate represents the reflectance [%]. A wide wavelength band AR film characteristic 53 represents the characteristic of an AR film having an eight-layer structure designed for a wide wavelength band of 450 nm (inclusive) to 950 nm (inclusive). Also, a narrow wavelength band AR film characteristic 54 represents the characteristic of an AR film having a three-layer structure designed for a narrow wavelength band of 580 nm (inclusive) to 620 nm (inclusive).

Referring to FIG. 12, in the narrow wavelength band AR film characteristic 54, the reflectance in the wavelength band of 580 nm (inclusive) to 620 nm (inclusive) is suppressed to 0.2% or less. On the other hand, in the wide wavelength band AR film characteristic 53, the reflectance in the wavelength band of 450 nm (inclusive) to 950 nm (inclusive) is suppressed to only about 0.8% to 1%. This indicates that, in a similar manner to the polarized beam splitter characteristics, there is a trade-off between the broad wavelength characteristics (film characteristics) and the absolute value of the reflectance, and that the broad wavelength characteristics and the absolute value of the reflectance are not compatible. This is also due to film absorption caused by the increase in the AR film layers and the light amount loss caused by the interference in the multilayer film. In addition, compared to the narrow wavelength band AR film characteristic 54, a periodic wave has also appeared in the wide wavelength band AR film characteristic 53. Furthermore, since it will also be difficult to obtain a good characteristic in the wide wavelength by using a phase plate such as the λ/4 plate 30 or the like, problems similar to those of the polarized beam splitter and the AR film will occur.

In this manner, as the width of wavelength band to be used in alignment increases, it becomes increasingly difficult to design various kinds of optical members such as the polarized beam splitter, the phase plate, and the like, films such as the AR film and the like, and the characteristics of these optical members and films will degrade.

Figure 13:
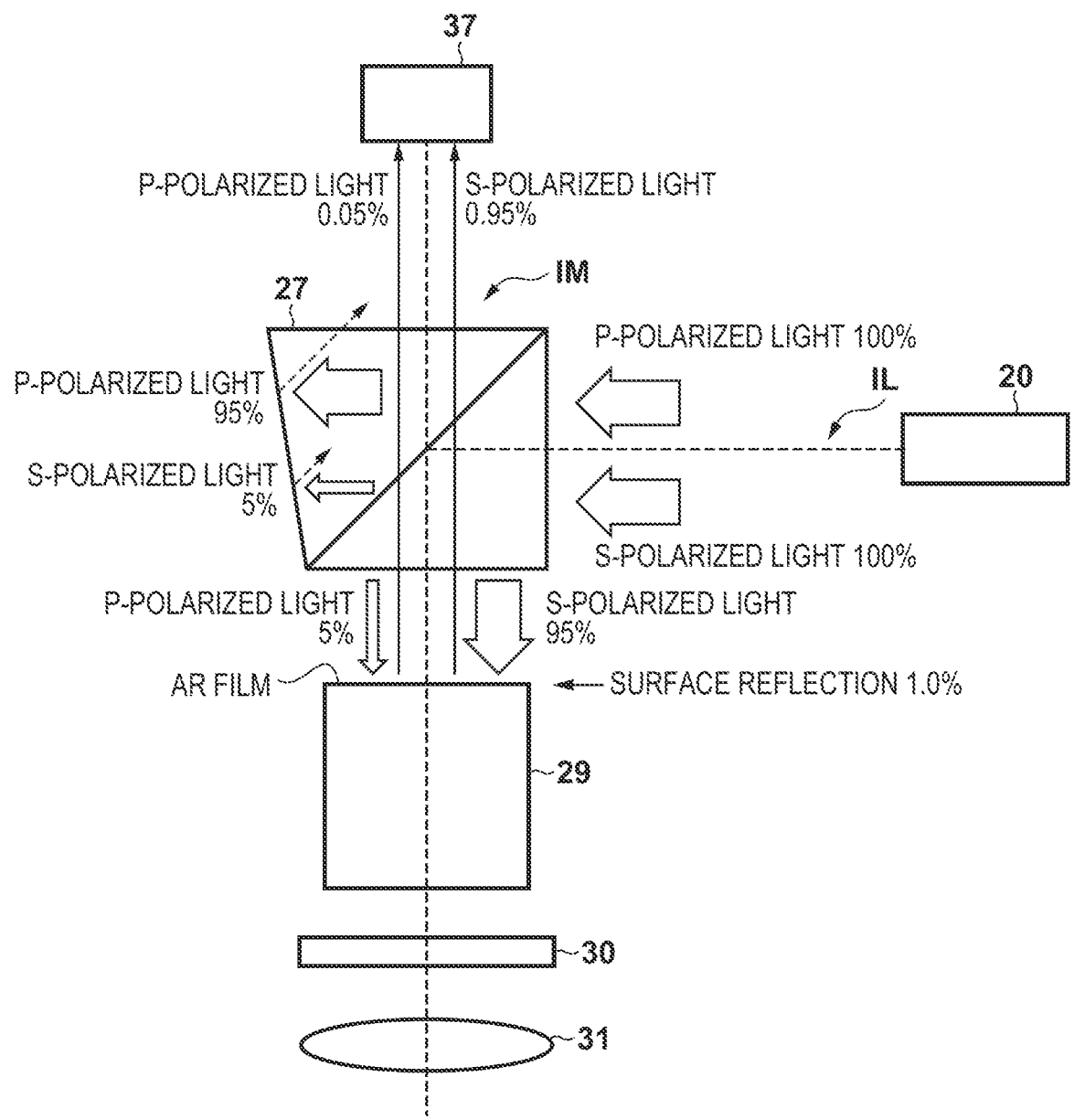
FIG. 13 is a schematic view showing an arrangement near the polarized beam splitter of the substrate alignment measurement system.

A problem that occurs when a polarized beam splitter which has the characteristics shown in FIG. 11 and an AR film which has the characteristics shown in FIG. 12 are applied to the substrate alignment measurement system 16 will be described with reference to FIG. 13. FIG. 13 is a schematic view showing the arrangement near the polarized beam splitter 27 of the substrate alignment measurement system 16.

Light emitted from the light source 20 is a non-polarized light as shown in FIG. 13 and includes equal amounts of S-polarized light and P-polarized light. Hence, light which is 100% S-polarized light and 100% P-polarized light is guided to the polarized beam splitter 27. Since the polarized beam splitter 27 has the characteristics shown in FIG. 11, that is, is a reflective polarizer in which the reflectance of S-polarized light is higher than the reflectance of P-polarized light, the S-polarized light cannot be reflected 100%, and only 95% of the S-polarized light will be reflected to the side of the substrate. At this time, 5% of the P-polarized light will also be reflected to the substrate side by the polarized beam splitter 27. On the other hand, although 95% of the S-polarized light and 5% of the P-polarized light will be transmitted through the polarized beam splitter 27, the surface on the opposite side of the light source 20 of the polarized beam splitter 27 is sloped so the light reflected by this surface will not return.

The 95% of S-polarized light and the 5% of P-polarized light reflected by the polarized beam splitter 27 to the substrate side are transmitted through the AF prism 29, arranged between the polarized beam splitter 27 and the λ/4 plate 30, and illuminate the substrate 3 via the objective lens 31. Here, if an AR film which has the characteristics shown in FIG. 12 is formed on the surface of the AF prism 29, about 1.0% (MAX) of surface reflection will be generated by the AF prism 29 depending on the wavelength band of the light emitted from the light source 20. Thus, a total of 1% of the 95% of S-polarized light and the 5% of P-polarized light is reflected by the AF prism 29 and reaches the photoelectric conversion device 37 without reaching the substrate 3. In other words, if the incident light amount is assumed to be 200% which is the total of S-polarized light and P-polarized light, 1.0% which is the total of 0.95% of S-polarized light and 0.05% of P-polarized light will become the flare light that directly reaches the photoelectric conversion device 37 without illuminating the substrate 3. The ratio (flare ratio) of the flare light amount to the incident light amount is 1.0%/200%=0.5%. However, in a case in which dark-field illumination is used for alignment or in a case in which the process wafer has a high absorption rate, the alignment signal will become buried in the flare light because the signal intensity will be low.

Figure 14:
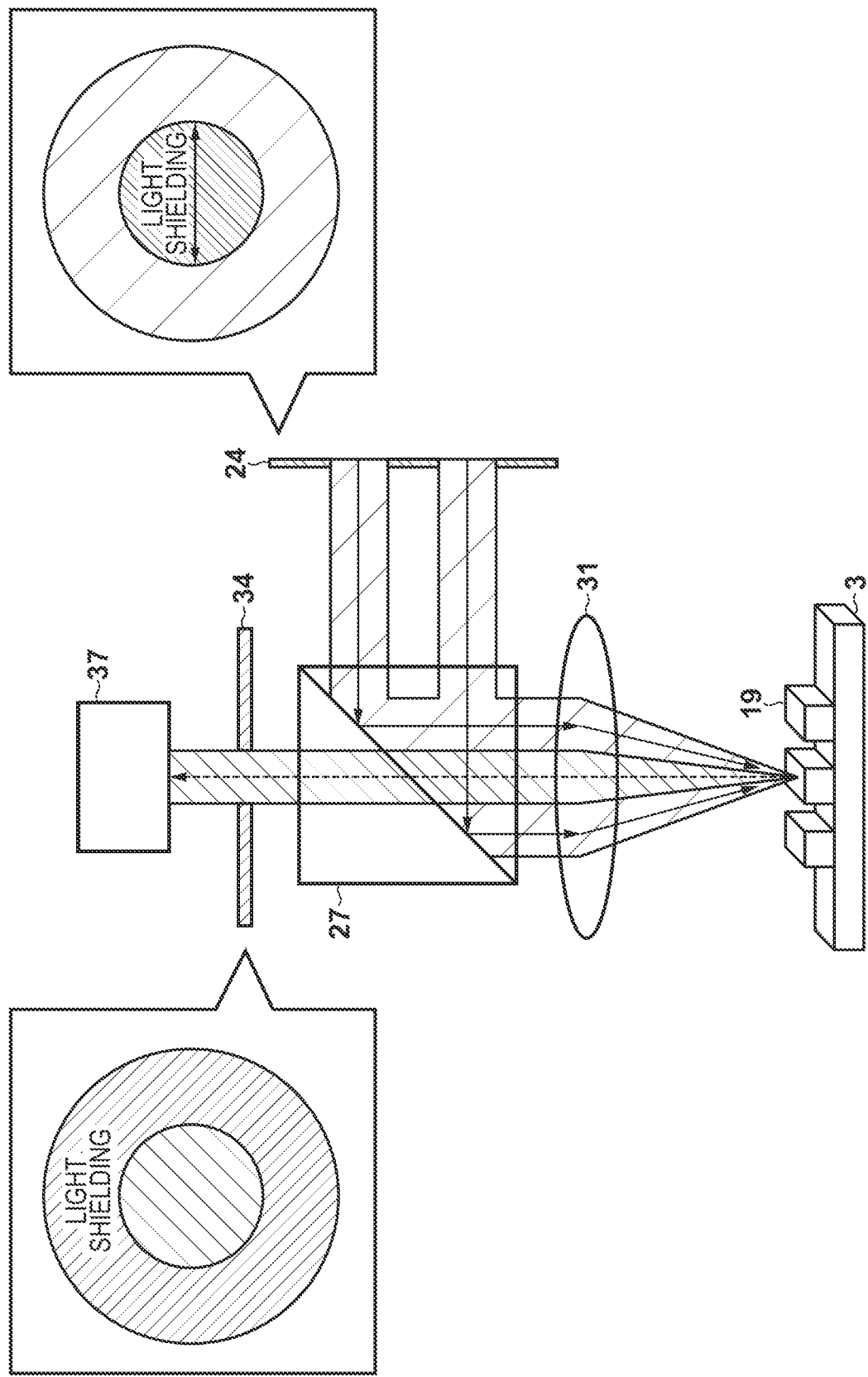
FIG. 14 is a view for explaining the principle of dark-field illumination.

The principle of dark-field illumination will be described here with reference to FIG. 14. FIG. 14 shows a simplified arrangement of the substrate alignment measurement system 16 centered around the relationship between the aperture stop plate 24 and the aperture stop 34. In dark-field illumination, light is obliquely projected onto the alignment mark 19 provided on the substrate 3, and higher order diffracted light, scattered light, and the like from the alignment mark 19 are detected without detecting 0th-order diffracted light from the alignment mark 19. Since light is obliquely projected onto the alignment mark 19, a light shielding portion is arranged at the center in a ring shape from the aperture stop provided on the aperture stop plate 24, and the aperture stop in which a light transmitting portion has been arranged at the periphery of the light shielding portion is selected. Also, an aperture stop for detecting higher order diffracted light and scattered light without detecting the 0th-order diffracted light from the alignment mark 19 is used as the aperture stop 34. More specifically, an aperture stop in which a light transmitting portion is arranged at the center and a light shielding portion is arranged at the periphery of the light transmitting portion, that is, an aperture stop in which the light shielding portion is arranged at a position exclusive to the light shielding portion of the aperture stop selected in the aperture stop plate 24 will be used as the aperture stop 34.

Since 0th-order diffracted light from the alignment mark 19 is not detected in dark-field illumination, higher order diffracted light and scattered light cannot be detected from a stepless flat portion such as a non-mark portion where the alignment mark 19 is not arranged, and the signal intensity from the flat portion will be zero. In other words, since the signal intensity from the flat portion will be zero, portions other than the alignment mark 19 will become dark in dark-field illumination.

Although the signal intensity from the flat portion is zero, signal intensities of higher order diffracted light and scattered light can be obtained, albeit weakly, from the alignment mark 19. Hence, if the flare light can be suppressed in the substrate alignment measurement system 16, only the alignment signal (mark signal) will be obtained, and it will be possible to implement a high contrast. On the other hand, in dark-field illumination, since 0th-order diffracted light is not included in the alignment signal, the intensity of the alignment signal is low, and the light amount (illumination light amount) will need to be increased to a level at which the alignment signal can be detected. However, if the light amount is increased, the contrast will degrade due to the flare light generated in the substrate alignment measurement system 16.

Figure 15:
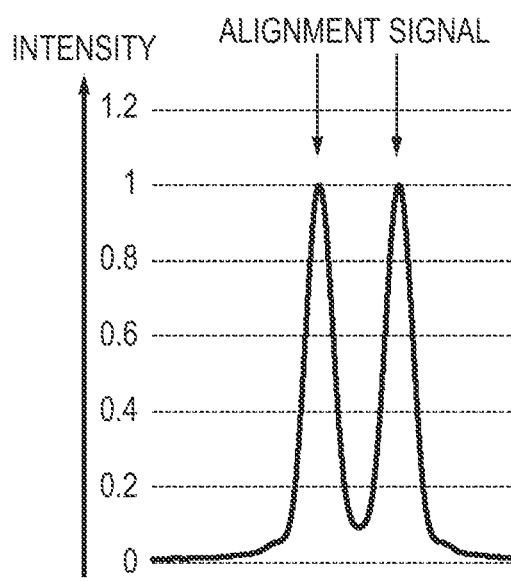
FIG. 15 is a graph showing the waveform of an ideal alignment signal.

FIG. 15 is a graph showing the waveform of an ideal alignment signal which is obtained when the flare light is not generated in the substrate alignment measurement system 16. Referring to FIG. 15, it can be seen that the signal intensity from the alignment mark 19 is high, and the intensity from the base is zero because the flare light is not superimposed on the base. Although the absolute value of the intensity of the alignment signal is small in dark-field illumination, the signal intensity will increase by increasing the light amount, prolonging the accumulation time of the photoelectric conversion device 37, or the like as long as the flare light is not superimposed on the base. Note that the intensity of the alignment signal has been normalized to 1 in FIG. 15.

Figure 16:
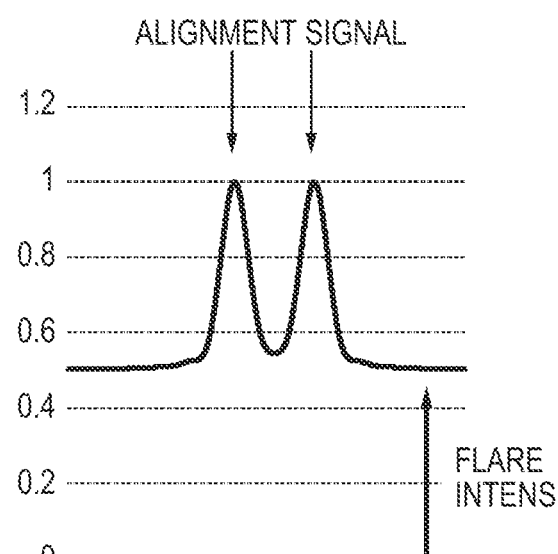
FIG. 16 is a graph showing the waveform of an alignment signal.

FIG. 16 is a graph showing the waveform of an alignment signal that is obtained in a case in which flare light corresponding to half of the intensity of the alignment signal has been generated in the substrate alignment measurement system 16. Referring to FIG. 16, although the normalized signal intensity from the alignment mark 19 is 1 and the same as the ideal alignment signal, the signal intensity of the base has increased because of the signal intensity from the flare light (the flare intensity is 0.5).

In general, contrast is evaluated by a value obtained by subtracting the signal intensity of the base from the intensity of the alignment signal. Hence, although the contrast of the alignment signal shown in FIG. 15 is (alignment signal intensity 1)−(base signal intensity 0)=1, the contrast of the alignment signal shown in FIG. 16 is (alignment signal intensity 1)−(base signal intensity 0.5)=0.5.

Measurement can be performed more advantageously as the contrast increases. Thus, generally in dark-field illumination, if the alignment signal intensity is set to 1, the base signal intensity needs to be suppressed to be 0.3 or less. If the base signal intensity exceeds 0.3, the measurement accuracy will degrade because a measurement error may occur or the signal intensity may vary in the substrate due to process variation even if measurement is performed.

Figure 17:
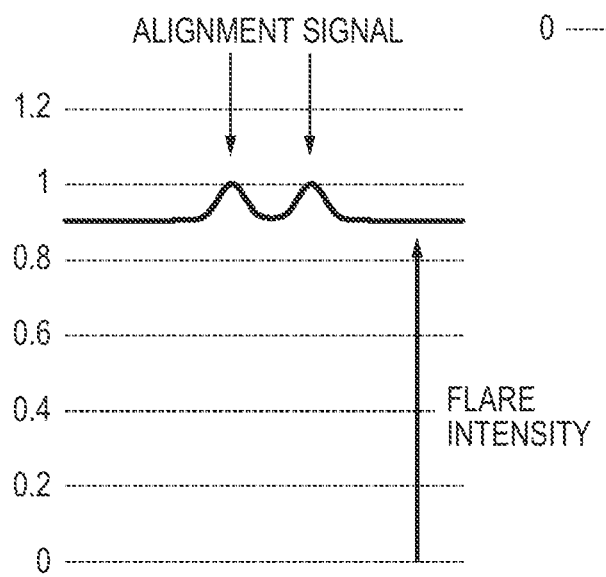
FIG. 17 is a graph showing an example of the waveform of the alignment signal.

As shown in FIG. 13, in a case in which the flare ratio with respect to the incident light amount is 0.5%, if the signal intensity from the alignment mark 19 is low at about 0.55% in dark-field illumination, the alignment signal will become buried in the flare intensity (flare light) as shown in FIG. 17. As described above, in dark-field illumination, since very weak higher order diffracted light, scattered light, and the like are detected without detecting 0th-order diffracted light from the alignment mark 19, the signal intensity from the alignment mark 19 may sometimes be about 0.55%. If the alignment signal intensity is set to 1 when the flare ratio is 0.5% with respect to the signal intensity of 0.55% from the alignment mark 19, it means that the flare intensity is close to 0.9 (≈0.5%/0.55%). Referring to FIG. 17, it can be seen that the flare intensity is 0.9 compared to the alignment intensity of 1, and the signal intensity of the base greatly exceeds 0.3 which is the target (threshold) in dark-field illumination.

In this manner, in a case in which the flare ratio with respect to the incident light amount is high (the substrate alignment measurement system 16 shown in FIG. 13), a low alignment intensity increases the possibility that the measurement accuracy will degrade and a measurement error will occur. Hence, it is important to reduce (suppress) the flare light that is generated in the substrate alignment measurement system 16.

Figure 18:
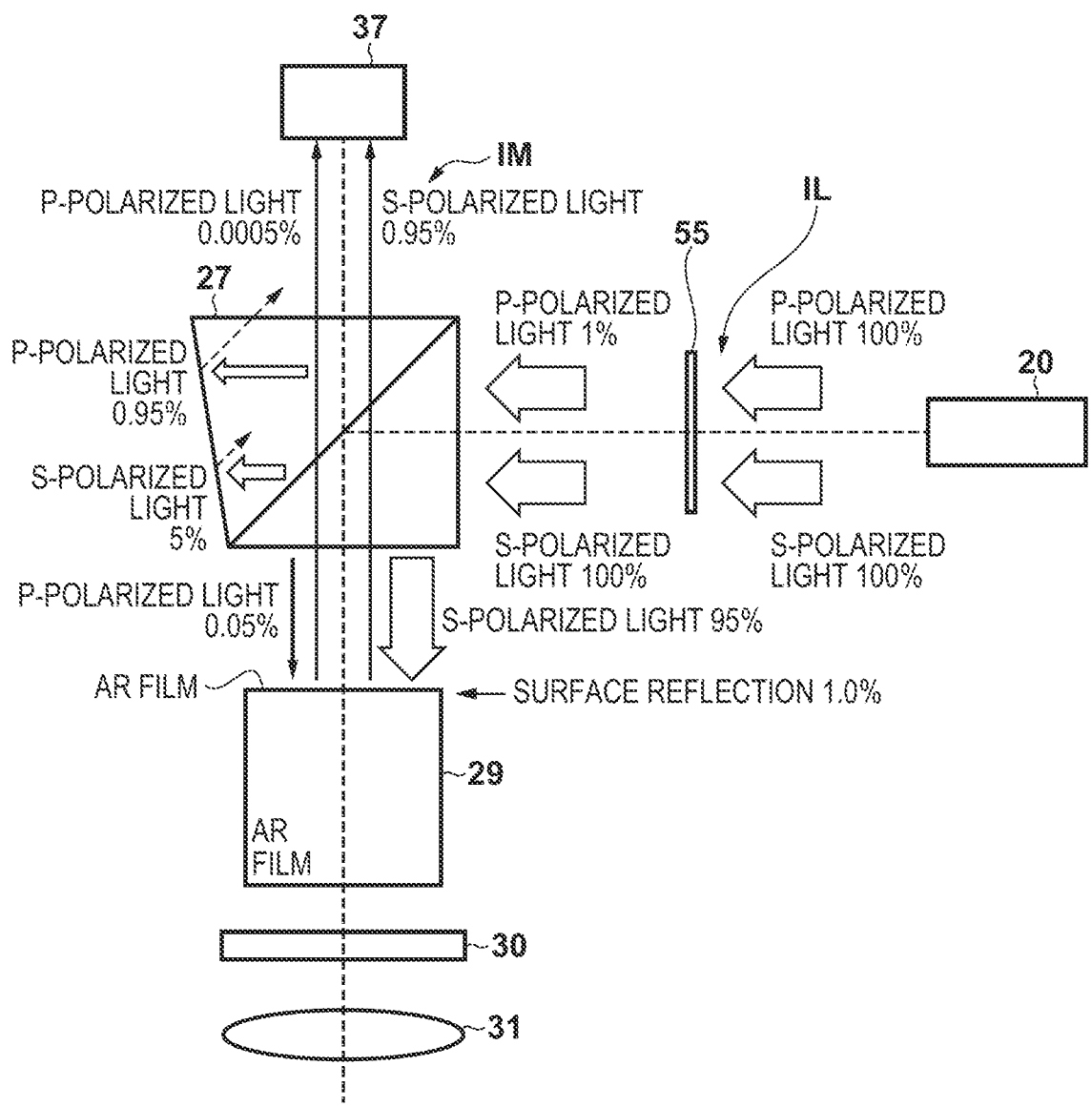
FIG. 18 is a schematic view showing an arrangement near the polarized beam splitter of the substrate alignment measurement system according to this embodiment.

Therefore, this embodiment provides a technique for implementing reduction of flare light generated in the substrate alignment measurement system 16 while using light belonging to a wide wavelength band. FIG. 18 is a schematic view showing an arrangement near the polarized beam splitter 27 of the substrate alignment measurement system 16 according to this embodiment. In this embodiment, the substrate alignment measurement system 16 includes, as shown in FIG. 18, a polarizer 55 in the illumination system IL. In the polarizer 55 according to this embodiment, the transmittance of S-polarized light is higher than the transmittance of P-polarized light. More specifically, the polarizer 55 is a transmission polarizer in which only the S-polarized light is transmitted 100% and the transmittance of the P-polarized light is suppressed to 1%. The polarizer 55 is formed by, for example, a polarized beam splitter, a wire grid, or the like.

As shown in FIG. 18, light emitted from the light source 20 is non-polarized light and includes equal amounts of S-polarized light and P-polarized light. Hence, 100% of S-polarized light and 100% of P-polarized light are guided to the polarizer 55. In the polarizer 55, since the transmittance of S-polarized light is 100% and the transmittance of P-polarized light is 1%, 100% of S-polarized light and 1% of P-polarized light are transmitted through the polarizer 55 and reach the polarized beam splitter 27. Since the polarized beam splitter 27 is a reflective polarizer which has the characteristics shown in FIG. 11, that is, a reflective polarizer in which the reflectance of S-polarized light is higher than the reflectance of P-polarized light, the S-polarized light cannot be reflected 100%. Only 95% of the S-polarized light is reflected to the substrate side, and 5% of the P-polarized light is reflected to the substrate side. Thus, 95% of S-polarized light and 0.05% of P-polarized light will reach the AF prism 29 arranged between the polarized beam splitter 27 and the λ/4 plate 30.

The AF prism 29 is a transmitting member provided with an AR film. In this embodiment, since an AR film which has the characteristics shown in FIG. 12 is formed on the surface of the AF prism 29, a surface reflection of about 1.0% is generated in the AF prism 29 as described above. Hence, 0.95% of S-polarized light and 0.0005% of P-polarized light are reflected by the AF prism 29 and reach the photoelectric conversion device 37 without reaching the substrate 3. In other words, 0.9505%, which is the total of 0.95% of S-polarized light and 0.0005% of P-polarized light, will become the flare light that directly reaches the photoelectric conversion device 37 without illuminating the substrate 3. The flare ratio with respect to the incident light amount is 0.47525% in this embodiment. In this manner, in this embodiment, the flare ratio with respect to the incident light amount has improved from the flare ratio (5%) of the substrate alignment measurement system 16 shown in FIG. 13. Therefore, the polarizer 55 is effective in reducing the influence of P-polarized light reflected by the polarized beam splitter 27.

Figure 19:
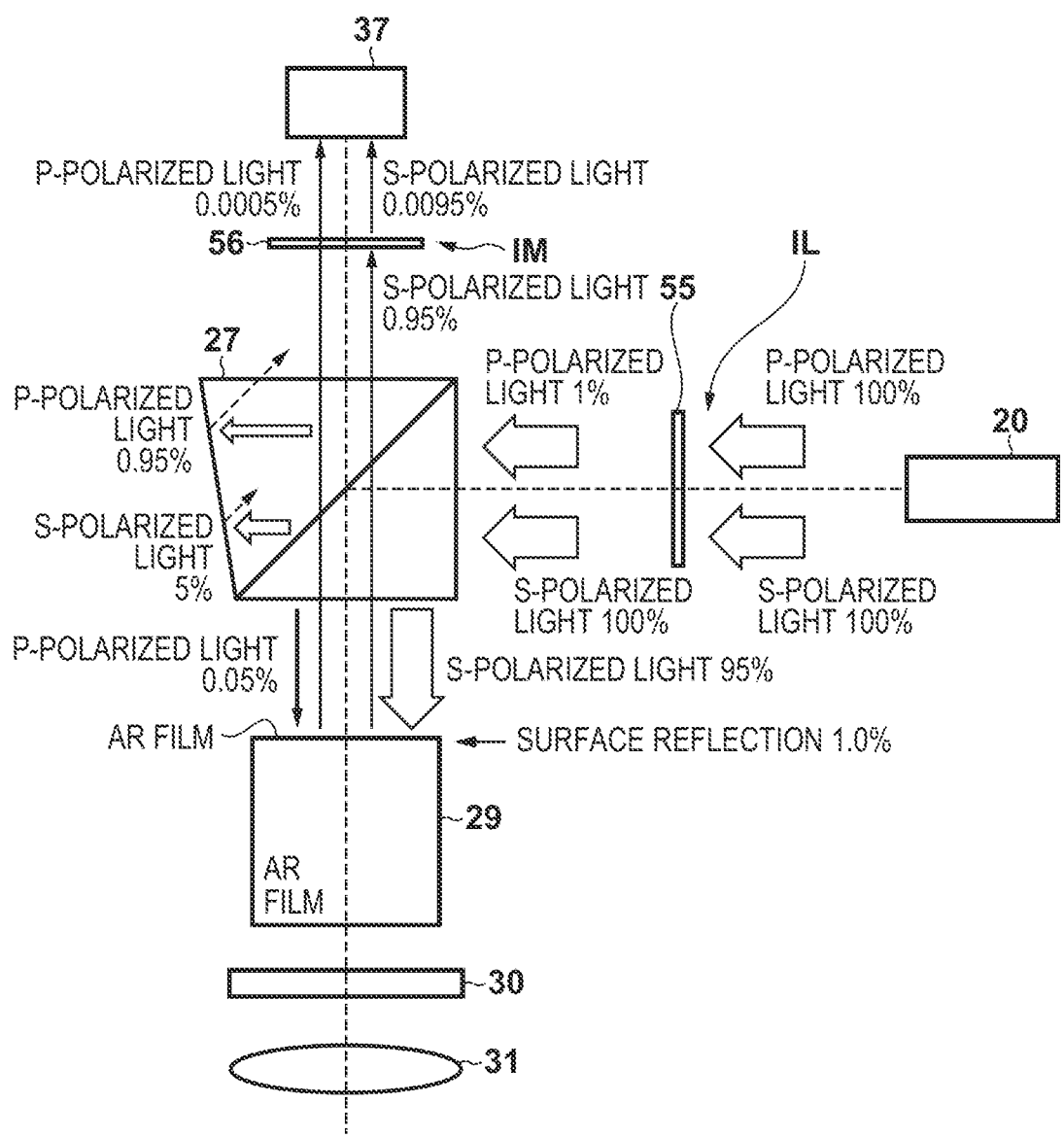
FIG. 19 is a schematic view showing anther arrangement near the polarized beam splitter of the substrate alignment measurement system according to the embodiment.

FIG. 19 is a schematic view showing another arrangement near the polarized beam splitter 27 of the substrate alignment measurement system 16 according to this embodiment. In this embodiment, the substrate alignment measurement system 16 further includes a polarizer 56 in the image forming system IM in addition to the polarizer 55 included in the illumination system IL as shown in FIG. 19. In this embodiment, in the polarizer 56, the transmittance of P-polarized light is higher than the transmittance of S-polarized light. More specifically, the polarizer 56 is a transmission polarizer in which only the P-polarized light is transmitted 100% and the transmittance of S-polarized light is suppressed to 1%. The polarizer 56 is formed by, for example, a polarized beam splitter, a wire grid, or the like. The transmission polarization axes of polarizer 55 and the polarizer 56 are optically perpendicular to each other.

Light emitted from the light source 20 is a non-polarized light and includes equal amounts of S-polarized light and P-polarized light as shown in FIG. 19. Hence, 100% of S-polarized light and 100% of P-polarized light are guided to the polarizer 55. As described above, since the transmittance of S-polarized light is 100% and the transmittance of P-polarized light is 1% in polarizer 55, 100% of S-polarized light and 1% of P-polarized light are transmitted through the polarizer 55 and reach the polarized beam splitter 27. Since the polarized beam splitter 27 has the characteristics shown in FIG. 11, that is, is a reflective polarizer in which the reflectance of S-polarized light is higher than the reflectance of P-polarized light, the S-polarized light cannot be reflected 100%, and only 95% of the S-polarized light will be reflected to the side of the substrate and 5% of P-polarized light will be reflected to the substrate side. Hence, 95% of S-polarized light and 0.05% of P-polarized light will reach the AF prism 29 arranged between the polarized beam splitter 27 and the λ/4 plate 30.

The AF prism 29 is a transmitting member provided with an AR film. In this embodiment, since an AR film which has the characteristics shown in FIG. 12 is formed on the surface of the AF prism 29, a surface reflection of about 1.0% is generated in the AF prism 29 as described above. Hence, 0.95% of S-polarized light and 0.0005% of P-polarized light are reflected by the AF prism 29 to the image forming system side without reaching the substrate 3.

The 0.95% of S-polarized light and the 0.0005% of P-polarized light reflected to the image forming system side will reach the polarizer 56. As described above, since the transmittance of P-polarized light is 100% and the transmittance of S-polarized light is 1% in the polarizer 56, 0.0095% of S-polarized light and 0.0005% of P-polarized light are transmitted through the polarizer 56 and will reach the photoelectric conversion device 37. Hence, 0.01% of light which is a total of the 0.0095% of S-polarized light and the 0.0005% of P-polarized light becomes flare light that directly reaches the photoelectric conversion device 37 without illuminating the substrate 3. The flare ratio with respect to the incident light amount is 0.005% in this embodiment. In this manner, in this embodiment, the flare ratio with respect to the incident light amount has improved to 1/100 of the flare ratio (5%) of the substrate alignment measurement system 16 shown in FIG. 13. Therefore, the polarizer 56 is effective in reducing the influence of S-polarized light transmitted through the polarized beam splitter 27.

Figure 20:
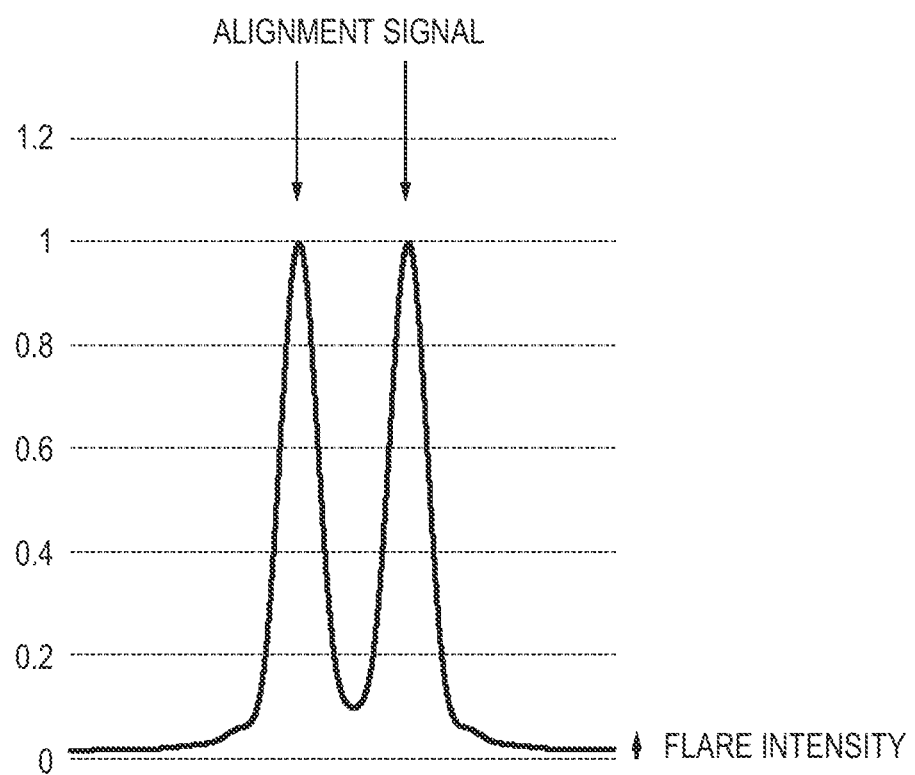
FIG. 20 is a graph showing an example of the waveform of the alignment signal.

In dark-field illumination, in a case in which the signal intensity from the alignment mark 19 is about 0.55% and is low, if the flare ratio is set to 0.5% (FIG. 13) as described above, the alignment signal will become buried in the flare intensity as shown in FIG. 17. However, according to the embodiment as shown in FIGS. 18 and 19, it is possible to improve this state in which the alignment signal becomes buried in the flare intensity. For example, in the embodiment shown in FIG. 19, even if the signal intensity from the alignment mark 19 is 0.55%, an alignment signal as shown in FIG. 20 can be obtained because the flare ratio has been reduced to 0.005%. FIG. 20 is a graph showing the waveform of the signal obtained in the substrate alignment measurement system 16 shown in FIG. 19. The fact that the flare ratio is 0.05% with respect to the signal intensity of the alignment mark 19 which is at 0.55% means that the flare intensity is about 0.01 (≈0.005%/0.55%) when the alignment signal intensity is 1. Referring to FIG. 20, the flare intensity is about 0.01 with respect to an alignment signal intensity of 1, and the base signal intensity is equal to or less than 0.3 which is the target (threshold) of dark-field illumination.

In this embodiment, in the substrate alignment measurement system 16 which includes at least one optical member (for example, AF prism 29) between the polarized beam splitter 27 and the λ/4 plate 30, a polarizer is included in the illumination system IL or polarizers are included the illumination system IL and the image forming system IM. As a result, the contrast of the alignment signal obtained in the substrate alignment measurement system 16 can be improved greatly.

In addition, this embodiment described that the contrast of the alignment signal will improve. This means that that each alignment mark 19 can be detected even in a process with lower signal intensity from the alignment mark 19. For example, in order to implement a base signal intensity which is equal to or less than 0.3 which is the target base intensity in dark-field illumination, an alignment signal intensity of about 1.6% (≈0.5/(1/0.3)) is required since the flare ratio is 0.5% in the substrate alignment measurement system 16 shown in FIG. 13. On the other hand, since the flare ratio is 0.05% in the substrate alignment measurement system 16 shown in FIG. 19, the alignment mark 19 can be detected even if the alignment signal intensity is about 0.016% (≈0.005/(1/0.3)). In other words, compared to the substrate alignment measurement system 16 shown in FIG. 13, the substrate alignment measurement system 16 shown in FIG. 19 can detect the alignment mark 19 even if the signal intensity from the alignment mark 19 is 100 times darker.

Figure 21:
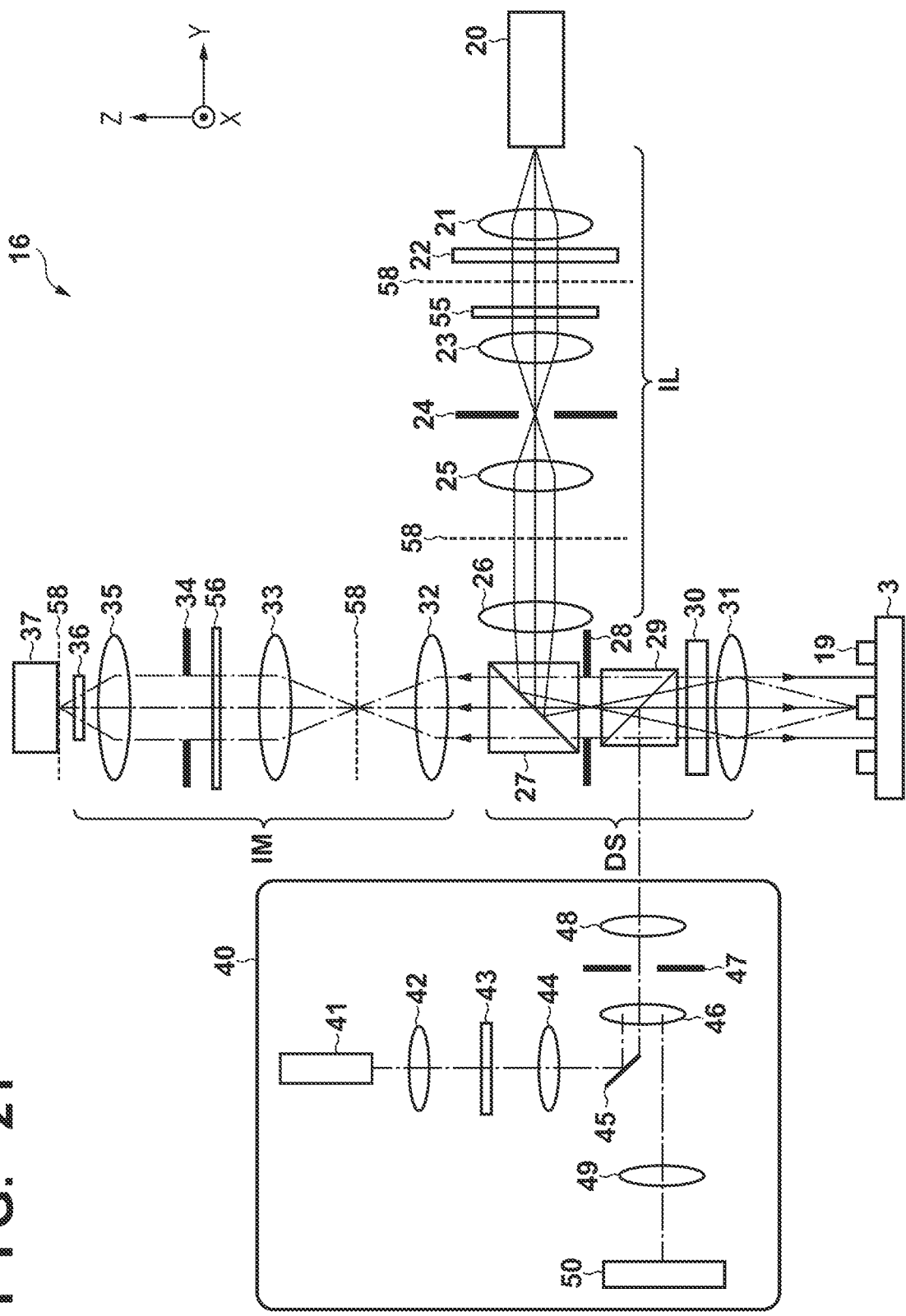
FIG. 21 is a schematic view showing the detailed arrangement of the substrate alignment measurement system according to the embodiment.

Note that although the arrangement near the polarized beam splitter 27 was mainly shown in FIG. 19 for the sake of descriptive convenience, the substrate alignment measurement system 16 actually includes the arrangement shown in FIG. 21. FIG. 21 is a schematic view showing the more specific arrangement of the substrate alignment measurement system 16 according to this embodiment.

In addition, although dark-field illumination has been described above as an example of a case in which the signal intensity from the alignment mark 19 is low, the substrate alignment measurement system 16 according to this embodiment can also be adopted in bright-field illumination.

Figure 22:
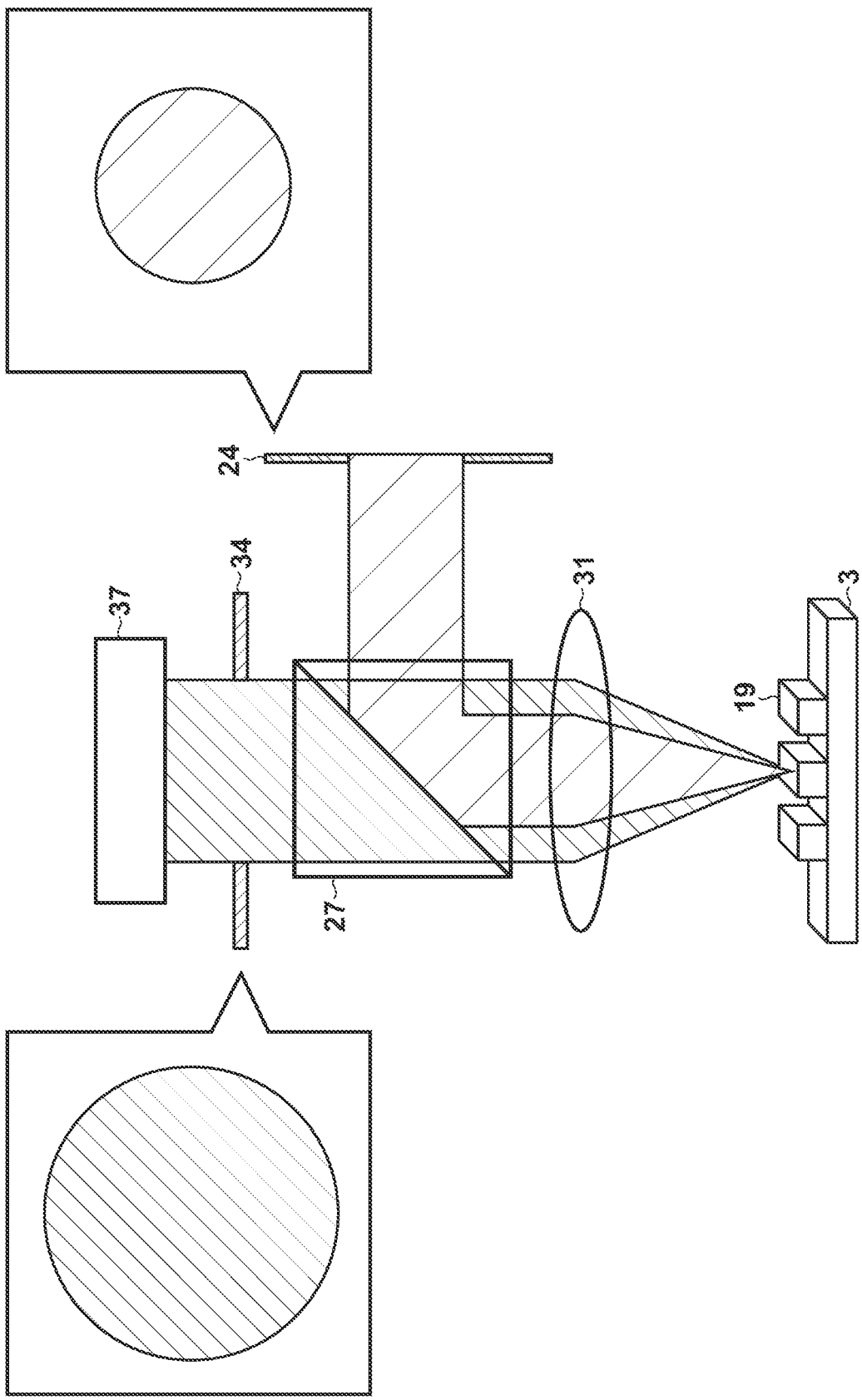
FIG. 22 is a view for explaining the principle of bright-field illumination.

The principle of bright-field illumination will be described with reference to FIG. 22. FIG. 22 simplifies and shows the substrate alignment measurement system 16 centered around the relationship between the aperture stop plate 24 and the aperture stop 34. An aperture stop which is different from the aperture stop used in dark-field illumination (that is, the aperture stop will be switched) is used in bright-field illumination.

In bright-field illumination, since light is projected perpendicularly onto each alignment mark 19 arranged on the substrate 3 and 0th-order diffracted light from the alignment mark 19 is detected, the light amount from the alignment mark 19 is high compared to that in dark-field illumination. On the other hand, since 0th-order diffracted light from a stepless flat portion such as a non-marked portion without the alignment mark 19 will also be detected, the light amount from the flat portion is also high. Hence, the contrast of the alignment signal will be lower in bright-field illumination than in dark-field illumination.

Figure 23:
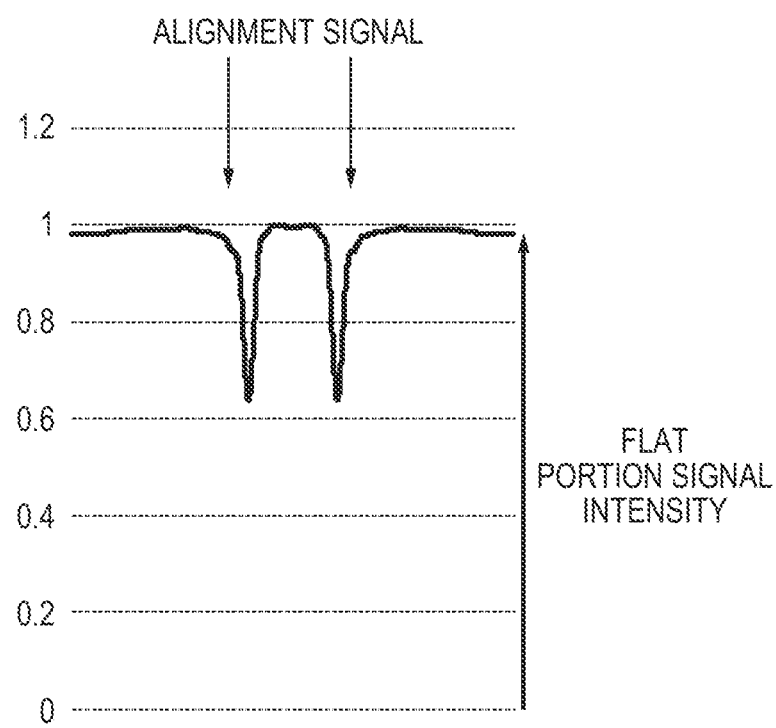
FIG. 23 is a graph showing an example of the waveform of the alignment signal.
Figure 24:
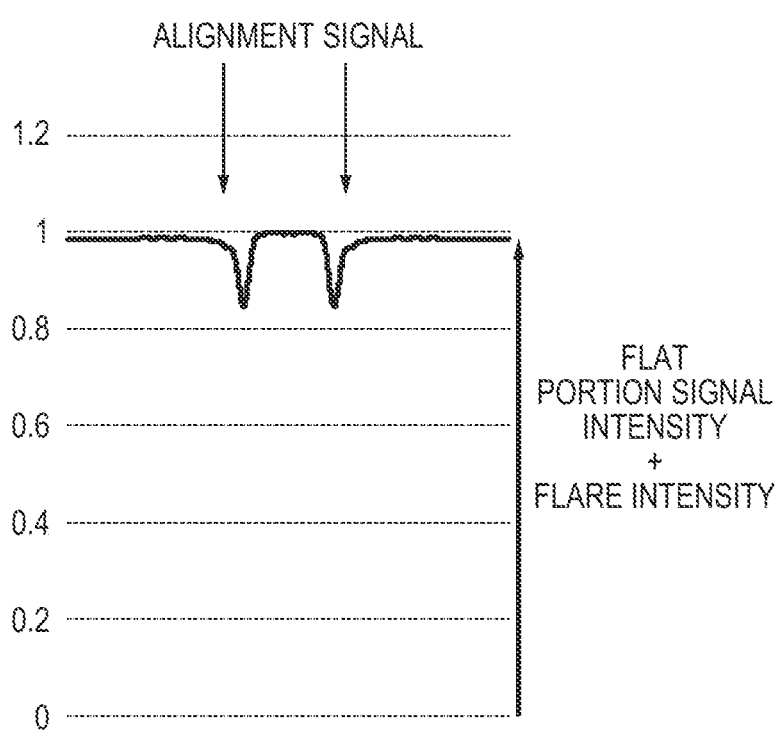
FIG. 24 is a graph showing an example of the waveform of the alignment signal.

FIG. 23 is a graph showing an example of the waveform of an alignment signal obtained in bright-field illumination. Referring to FIG. 23, it can be seen that the signal intensity from the flat portion (flat portion signal intensity) is high since 0th-order diffracted light is also detected from the flat portion in bright-field illumination as described above. FIG. 24 is a graph showing the waveform of an alignment signal obtained when flare light has been generated in the substrate alignment measurement system 16 in bright-field illumination. Referring to FIG. 24, it can be seen that the alignment signal intensity has relatively decreased and that the contrast has degraded because a flare intensity different from the alignment signal has been added to the flat portion intensity (base). Since the light amount from the alignment mark 19 and the light amount from the flat portion will decrease if the absorption rate of the process wafer is high even in the case of bright-field illumination, the influence of the flare light will be relatively high unless the flare light generated in the substrate alignment measurement system 16 is reduced. As a result, as shown in FIG. 24, the contrast of the alignment signal will degrade. Hence, it is important to reduce the generation of flare light in the substrate alignment measurement system 16 regardless of whether dark-field illumination or bright-field illumination is employed for alignment.

This embodiment mainly described an example of a case in which a polarizer is included in each of the illumination system IL and the image forming system IM of substrate alignment measurement system 16 as shown in FIGS. 19 and 21. However, even in a case in which a polarizer is included in only the illumination system IL of substrate alignment measurement system 16 as shown in FIG. 18, it is possible to reduce the generation of flare light in the substrate alignment measurement system 16. Furthermore, even in a case in which a polarizer is included in only the image forming system IM, it is possible to reduce the generation of flare light in the substrate alignment measurement system 16. In this manner, in the substrate alignment measurement system 16, it is sufficient to have an arrangement in which at least one of the illumination system IL and the image forming system IM includes a polarizer.

Figure 25:
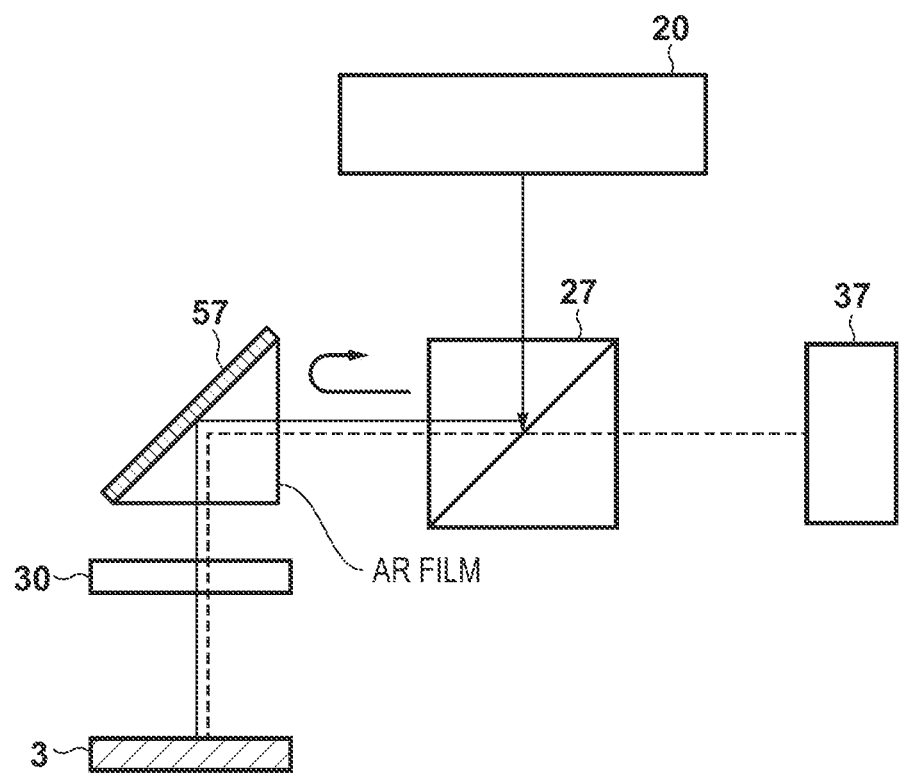
FIG. 25 is a schematic view showing the arrangement near the polarized beam splitter of the substrate alignment measurement system according to this embodiment.

In addition, this embodiment described an example in which the AF prism 29 was used as the at least one optical member arranged between the polarized beam splitter 27 and the λ/4 plate 30. However, the present invention is not limited to this. For example, as shown in FIG. 25, the at least one optical member arranged between the polarized beam splitter 27 and the λ/4 plate 30 may be a total reflection prism 57. FIG. 25 is a schematic view showing an arrangement near the polarized beam splitter 27 of the substrate alignment measurement system 16 in which the total reflection prism 57 has been arranged between the polarized beam splitter 27 and the λ/4 plate 30.

The total reflection prism 57 is a type of a mirror (reflecting member) that bends the optical axis (the light beam) of an optical system. Depending on the total reflection effect generated by a refractive index difference between the hypotenuse of the total reflection prism 57 and the air layer, the total reflection prism 57 can rotate the direction of the light beam by 90° without any loss in the light amount. Since a general surface reflection mirror is formed with (coated with) a metal film such as aluminum, the reflectance of the surface reflection mirror is about 90%, and about 10% of the light amount will be lost. Hence, the total reflection prism 57 is advantageous in terms of the light amount, that is, in rotating the light beam without any loss in the light amount. However, the total reflection prism 57 has a problem in that the light reflected by the polarized beam splitter 27 will become flare light when the reflected light is reflected by the AR film provided on the surface of the glass material of the total reflection prism 57. In this manner, flare light will be generated in the substrate alignment measurement system 16 even if the total reflection prism 57 is arranged between the polarized beam splitter 27 and the λ/4 plate 30. Therefore, by arranging a polarizer in at least one of the illumination system IL and image forming system IM of the substrate alignment measurement system 16 as described above, it becomes possible to reduce the generation of flare light in the substrate alignment measurement system 16.

This embodiment described an example of a case in which one AF prism 29 or one total reflection prism 57 is arranged between the polarized beam splitter 27 and the λ/4 plate 30. However, the present invention is not limited to this. For example, the AF prism 29 and the total reflection prism 57 may be arranged between the polarized beam splitter 27 and the λ/4 plate 30. A plurality of optical members may be arranged between the polarized beam splitter 27 and the λ/4 plate 30 in this manner.

Also, although the polarized beam splitter 27 has been illustrated as a prism-type polarized beam splitter in this embodiment, the polarized beam splitter 27 may be a mirror-type polarized beam splitter arranged by tilting a parallel flat plate by 45°.

Figure 26:
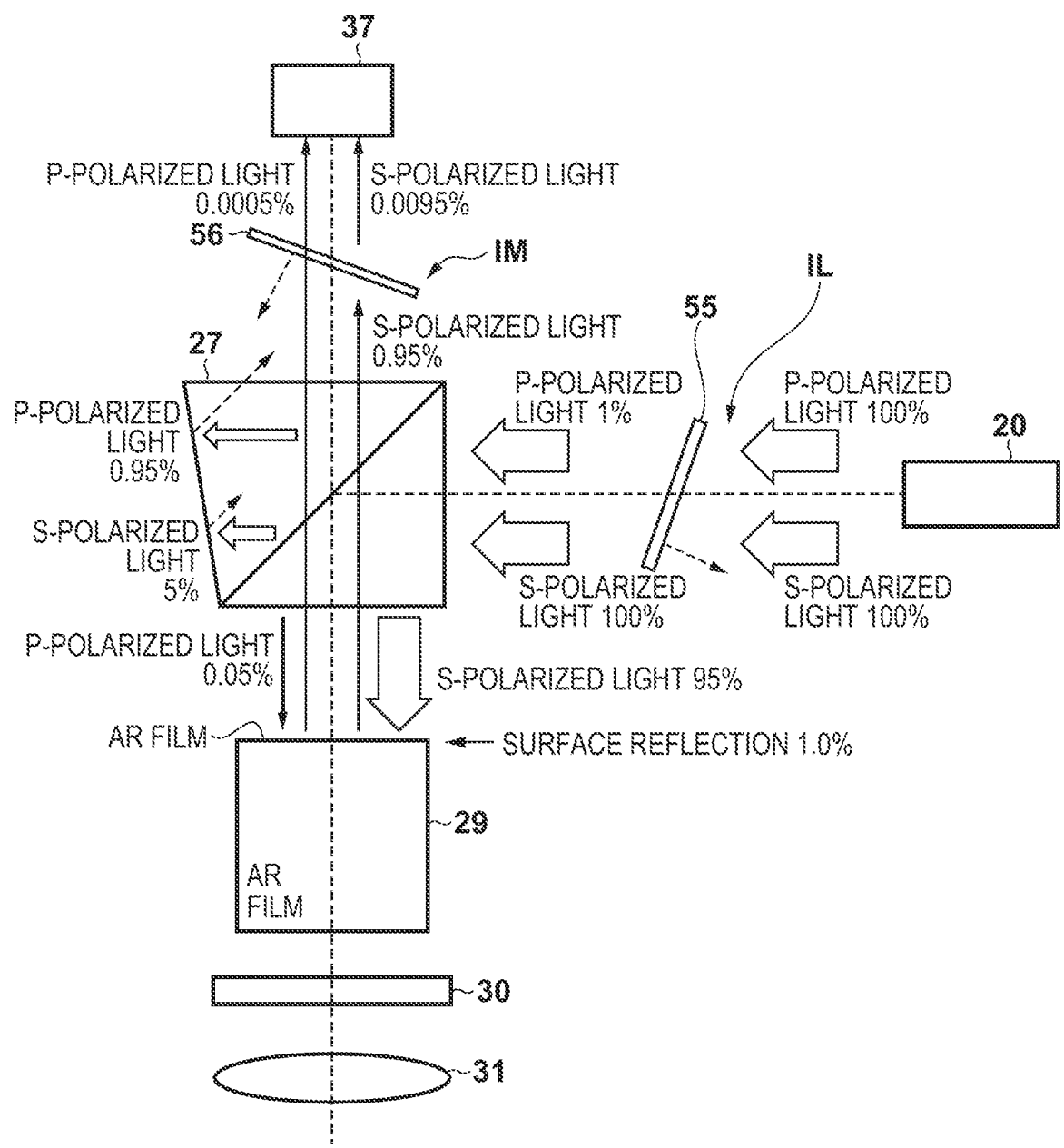
FIG. 26 is a schematic view showing the arrangement near the polarized beam splitter of the substrate alignment measurement system according to the embodiment.

In addition, in the substrate alignment measurement system 16, the polarizer 55 included in the illumination system IL can be arranged so as to be tilted with respect to the optical axis of the illumination system IL as shown in FIG. 26. In a similar manner, the polarizer 56 included in the image forming system IM can be arranged so as to be tilted with respect to the optical axis of the image forming system IM as shown in FIG. 26. FIG. 26 is a schematic view showing an arrangement near the polarized beam splitter 27 of the substrate alignment measurement system 16 according to this embodiment.

By arranging the polarizer 55 included in the illumination system IL to be tilted with respect to the optical axis, the light reflected by the surface of the polarizer 55 can be directed diagonally from the optical axis. For example, since the polarizer 55 will transmit only 1% of P-polarized light, 99% of P-polarized light will be reflected by the polarizer 55. If the polarizer 55 is not tilted but instead arranged perpendicularly with respect to the optical axis in this case, the 99% of P-polarized light reflected by the polarizer 55 will return to the light source 20, be reflected by the light source 20, reach and be transmitted through the polarizer 55 again, and become flare light. The amount of this kind of flare light is very small and can be ignored normally. However, it is necessary to reduce the influence from this kind of flare light in order to implement alignment with higher accuracy. As shown in FIG. 26, by arranging the polarizer 55 to be tilted with respect to the optical axis, 99% of the P-polarized light reflected by the polarizer 55 will not return to the light source 20 (that is, will not be reflected by the light source 20) and can be prevented from reaching the polarizer 55 again. In other words, it is possible to prevent flare light generation from 99% of the P-polarized light reflected by the polarizer 55.

In a similar manner, if the polarizer 56 included in the image forming system IM is not tilted but instead arranged perpendicularly with respect to the optical axis, 99% of S-polarized light reflected by the polarizer 56 will be reflected by the surface of the AF prism 29, reach and be transmitted through the polarizer 56 again, and become flare light. By arranging the polarizer 56 to be tilted with respect to the optical axis as shown in FIG. 26, 99% of the S-polarized light reflected by the polarizer 56 will not return to the AF prism 29 (that is, will not be reflected by the surface of the AF prism 29) and can be prevented from reaching the polarizer 56 again. In other words, it is possible to prevent flare light generation from 99% of the S-polarized light reflected by the polarizer 56.

In this manner, arranging each of the polarizer 55 included in the illumination system IL and the polarizer 56 included in the image forming system IM to be tilted with respect the corresponding optical axis is effective for reducing flare light generated in the substrate alignment measurement system 16. Also, the direction (rotation direction) in which each of the polarizers 55 and 56 is to be tilted may be determined by setting a direction perpendicular to the transmission axis as the rotation axis and making the illumination system IL and image forming system IM perpendicular to each other.

In addition, as shown in FIG. 21, each of the polarizers 55 and 56 is arranged on a plane (position) shifted from a plane (conjugate plane) 58 optically conjugate to the substrate 3. Each of the polarizers 55 and 56 can basically be arranged, in consideration of its performance, on a plane that does not have an incident light angle. Although each of the polarizer 55 and the polarizer 56 is an optical device that has a characteristic in which only a predetermined polarized light beam of the perpendicular incident light will be transmitted, there is concern that polarized light other than the predetermined polarized light will be transmitted if the incident light has an angle.

In the illumination system IL of the substrate alignment measurement system 16, a region in which light is without an angle, that is, the conjugate plane 58 is present between the first illumination system 25 and the second illumination system 26 and between the first capacitor optical system 21 and the second capacitor optical system 23. However, if the polarizer 55 is arranged at the conjugate plane 58, it may lead to false measurement because flaws and dust particles present on the surface of the polarizer 55 may be reflected on the substrate 3. Hence, it is preferable to arrange the polarizer 55 between the first illumination system 25 and the second illumination system 26 or the first capacitor optical system 21 and the second capacitor optical system 23 to avoid the conjugate plane 58. In this embodiment, as shown in FIG. 21, the polarizer 55 is arranged between the first capacitor optical system 21 and the second capacitor optical system 23, and thus arranged on a plane shifted from the conjugate plane 58.

On the other hand, in the image forming system IM of the substrate alignment measurement system 16, the conjugate plane 58 is present between the first image forming system 33 and the second image forming system 35 and on the incidence plane of the photoelectric conversion device 37. Hence, as shown in FIG. 21, it is preferable to arrange the polarizer 56 between the first image forming system 33 and the second image forming system 35 so the light will not have an angle and the conjugate plane 58 can be avoided. Note that although light will not have an angle and the conjugate plane 58 can be avoided in the space between the objective lens 31 and the relay lens 32, a plurality of optical members such as the polarized beam splitter 27, the AF prism 29, the λ/4 plate 30, and the like are already arranged in this space. Hence, in this embodiment, the polarizer 56 is shifted from the conjugate plane 58 by arranging the polarizer 56 between the first image forming system 33 and the second image forming system 35. As a result, good measurement can be obtained because the image of polarizer 56 will not be reflected onto the photoelectric conversion device 37 (the substrate 3).

In this manner, arranging each of the polarizer 55 included in the illumination system IL and the polarizer 56 included in the image forming system IM to be shifted from the conjugate plane 58 is effective for implementing good measurement by suppressing measurement accuracy degradation due to the polarizer 55 and the polarizer 56.

Furthermore, the polarized beam splitter 27 was described to be a reflective polarizer in which the reflectance of S-polarized light is higher than the reflectance of P-polarized light in this embodiment. However, it is possible to replace the polarized beam splitter 27 with a reflective polarizer in which the reflectance of P-polarized light is higher than the reflectance of S-polarized light. In this case, the polarizer 55 included in the illumination system IL can be a transmission polarizer in which transmittance of P-polarized light is higher than the transmittance of S-polarized light, and the polarizer 56 included in the image forming system IM can be a transmission polarizer in which the transmittance of S-polarized light is higher than the transmittance of P-polarized light.

According to the substrate alignment measurement system 16 of this embodiment, since it is possible to reduce flare light and greatly improve the contrast of the alignment signal, the measurement accuracy is improved, and the position of the substrate 3 can be measured with high accuracy. Therefore, the exposure apparatus 100 including the substrate alignment measurement system 16 can achieve a high overlay accuracy in the alignment of the reticle 1 and the substrate 3.

A method of manufacturing an article according to the embodiment of the present invention is preferable to manufacture an article such as a device (semiconductor device, magnetic storage medium, liquid crystal display element, or the like), color filter, optical component, or MEMS. This method of manufacturing includes a step of exposing a substrate coated with a photosensitive agent by using the exposure apparatus 100 according to the above-described embodiment and a step of developing the exposed photosensitive agent. An etching step and an ion implantation step are performed for the substrate using the pattern of the developed photosensitive agent as a mask, thereby forming a circuit pattern on the substrate. By repeating the steps such as the exposure, development, and etching steps, a circuit pattern formed from a plurality of layers is formed on the substrate. In a post-step, dicing (processing) is performed for the substrate on which the circuit pattern has been formed, and mounting, bonding, and inspection steps of a chip are performed. The method of manufacturing can further include other known steps (oxidation, deposition, vapor deposition, doping, planarization, resist removal, and the like). The method of manufacturing the article according to this embodiment is superior to the conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2019-015987 filed on Jan. 31, 2019, which is hereby incorporated by reference herein in its entirety.

What is claimed is:

1. A measurement apparatus that measures a position of an object to be detected, comprising:
    an illumination system configured to illuminate the object to be detected with illumination light;
    an image forming system configured to form, on a photoelectric conversion device configured to detect an image of the object to be detected, an image of detected light from the object to be detected; and
    a separation system including a reflective polarizer and a λ/4 plate arranged between the illumination system and the image forming system, and configured to separate an optical path of the illumination light and an optical path of the detected light via the reflective polarizer and the λ/4 plate,
    wherein the separation system includes at least one optical member arranged between the reflective polarizer and the λ/4 plate,
    the at least one optical member includes a flat surface and the illumination light transmitted through the flat surface of the at least one optical member illuminates the object to be detected, and the detected light transmitted through the flat surface of the at least one optical member forms the image on the photoelectric conversion device,
    at least one of the illumination system and the image forming system includes a transmission polarizer, and
    a reflectance of P-polarized light is higher than a reflectance of S-polarized light in the reflective polarizer.

2. The apparatus according to claim 1, wherein the at least one optical member includes a transmitting member on which an anti-reflection film configured to suppress reflection of the illumination light has been arranged.

3. The apparatus according to claim 2, wherein the transmitting member includes a dichroic prism.

4. The apparatus according to claim 1, wherein the at least one optical member includes a total reflection prism on which an anti-reflection film configured to suppress reflection of the illumination light has been arranged.

5. The apparatus according to claim 1, wherein the illumination system uses the illumination light to perform dark-field illumination on the object to be detected.

6. The apparatus according to claim 1, wherein the transmission polarizer included in the illumination system is arranged so as to be tilted with respect to an optical axis of the illumination system, and
    the transmission polarizer included in the image forming system is arranged so as to be tilted with respect to an optical axis of the image forming system.

7. The apparatus according to claim 1, wherein each of the transmission polarizer included in the illumination system and the transmission polarizer included in the image forming system is arranged on a plane shifted from a plane optically conjugate to the object to be detected.

8. The apparatus according to claim 1, wherein a width of a wavelength band of the illumination light is not less than 300 nm.

9. The apparatus according to claim 1, further comprising:
    a control unit configured to obtain the position of the object to be detected based on the image of the object to be detected that has been detected by the photoelectric conversion device.

10. An exposure apparatus comprising:
    a projection optical system configured to project a pattern of an original onto a substrate;
    a stage configured to hold the substrate;
    a measurement apparatus defined in claim 1 and configured to measure a position of the substrate as a position of an object to be detected; and
    a control unit configured to control, based on a measurement result from the measurement apparatus, a position of the stage.

11. A method of manufacturing an article, the method comprising:
    exposing a substrate by using an exposure apparatus defined in claim 10;
    developing the exposed substrate; and
    manufacturing the article from the developed substrate.

12. The apparatus according to claim 1, wherein in a case where each of the illumination system and the image forming system includes the transmission polarizer,
    a transmittance of the P-polarized light is higher than a transmittance of the S-polarized light in the transmission polarizer included in the illumination system, and
    the transmittance of the S-polarized light is higher than the transmittance of the P-polarized light in the transmission polarizer included in the image forming system.

13. The apparatus according to claim 2, wherein the transmittance of the P-polarized light is 100% and the transmittance of the S-polarized light is 1% in the transmission polarizer included in the illumination system, and
    the transmittance of the S-polarized light is 100% and the transmittance of the P-polarized light is 1% in the transmission polarizer included in the image forming system.

14. The apparatus according to claim 1, wherein the reflectance of P-polarized light in the reflective polarizer is not zero.

15. The apparatus according to claim 1, further comprising:
a focus measurement system configured to perform focus measurement by emitted focus measurement light to the object to be detected,
wherein the focus measurement light is transmitted through the at least one optical member.

16. A measurement apparatus that measures a position of an object to be detected, comprising:
an illumination system configured to illuminate the object to be detected with illumination light;
an image forming system configured to form, on a photoelectric conversion device configured to detect an image of the object to be detected, an image of detected light from the object to be detected; and
a separation system including a reflective polarizer and a λ/4 plate arranged between the illumination system and the image forming system, and configured to separate an optical path of the illumination light and an optical path of the detected light via the reflective polarizer and the λ/4 plate,
wherein the separation system includes at least one optical member arranged between the reflective polarizer and the λ/4 plate,
the at least one optical member includes a flat surface and the illumination light transmitted through the flat surface of the at least one optical member illuminates the object to be detected, and the detected light transmitted through the at least one optical member forms the image on the photoelectric conversion device,
at least one of the illumination system and the image forming system includes a transmission polarizer,
a reflectance of S-polarized light is higher than a reflectance of P-polarized light in the reflective polarizer, and
the reflectance of P-polarized light in the reflective polarizer is not zero.

17. The apparatus according to claim 16, wherein in a case where each of the illumination system and the image forming system includes the transmission polarizer,
a transmittance of the S-polarized light is higher than a transmittance of the P-polarized light in the transmission polarizer included in the illumination system, and
the transmittance of the P-polarized light is higher than the transmittance of the S-polarized light in the transmission polarizer included in the image forming system.

18. The apparatus according to claim 17, wherein the transmittance of the S-polarized light is 100% and the transmittance of the P-polarized light is 1% in the transmission polarizer included in the illumination system, and
the transmittance of the P-polarized light is 100% and the transmittance of the S-polarized light is 1% in the transmission polarizer included in the image forming system.

19. The apparatus according to claim 16, wherein the at least one optical member includes a transmitting member on which an anti-reflection film configured to suppress reflection of the illumination light has been arranged.

20. The apparatus according to claim 19, wherein the transmitting member includes a dichroic prism.

21. The apparatus according to claim 16, wherein the at least one optical member includes a total reflection prism on which an anti-reflection film configured to suppress reflection of the illumination light has been arranged.

22. The apparatus according to claim 16, wherein the illumination system uses the illumination light to perform dark-field illumination on the object to be detected.

23. The apparatus according to claim 16, wherein the transmission polarizer included in the illumination system is arranged so as to be tilted with respect to an optical axis of the illumination system, and
the transmission polarizer included in the image forming system is arranged so as to be tilted with respect to an optical axis of the image forming system.

24. The apparatus according to claim 16, wherein each of the transmission polarizer included in the illumination system and the transmission polarizer included in the image forming system is arranged on a plane shifted from a plane optically conjugate to the object to be detected.

25. The apparatus according to claim 16, wherein a width of a wavelength band of the illumination light is not less than 300 nm.

26. The apparatus according to claim 16, further comprising:
a control unit configured to obtain the position of the object to be detected based on the image of the object to be detected that has been detected by the photoelectric conversion device.

27. The apparatus according to claim 16, further comprising:
a focus measurement system configured to perform focus measurement by emitted focus measurement light to the object to be detected,
wherein the focus measurement light is transmitted through the at least one optical member.

28. An exposure apparatus comprising:
a projection optical system configured to project a pattern of an original onto a substrate;
a stage configured to hold the substrate;
a measurement apparatus defined in claim 16 and configured to measure a position of the substrate as a position of an object to be detected; and
a control unit configured to control, based on a measurement result from the measurement apparatus, a position of the stage.

29. A method of manufacturing an article, the method comprising:
exposing a substrate by using an exposure apparatus defined in claim 28;
developing the exposed substrate; and
manufacturing the article from the developed substrate.

30. A measurement apparatus that measures a position of an object to be detected, comprising:
an illumination system configured to illuminate the object to be detected with illumination light;
an image forming system configured to form, on a photoelectric conversion device configured to detect an image of the object to be detected, an image of detected light from the object to be detected; and
a separation system including a reflective polarizer and a λ/4 plate arranged between the illumination system and the image forming system, and configured to separate an optical path of the illumination light and an optical path of the detected light via the reflective polarizer and the λ/4 plate,
wherein the separation system includes at least one optical member arranged between the reflective polarizer and the λ/4 plate,
the at least one optical member includes a flat surface and the illumination light transmitted through the flat surface of the at least one optical member illuminates the object to be detected, and the detected light transmitted through the flat surface of the at least one optical member forms the image on the photoelectric conversion device, at least one of the illumination system and the image forming system includes a polarizer, in a case where the illumination system includes a polarizer, the polarizer included in the illumination system is arranged so as to be tilted with respect to an optical axis of the illumination system, in a case where the image forming system includes a polarizer, the polarizer included in the image forming system is arranged so as to be tilted with respect to an optical axis of the image forming system, and a reflectance of S-polarized light is higher than a reflectance of P-polarized light in the reflective polarizer, the reflectance of P-polarized light in the reflective polarizer is not zero.

31. A measurement apparatus that measures a position of an object to be detected, comprising:

an illumination system configured to illuminate the object to be detected with illumination light;

an image forming system configured to form, on a photoelectric conversion device configured to detect an image of the object to be detected, an image of detected light from the object to be detected; and a separation system including a reflective polarizer and a λ/4 plate arranged between the illumination system and the image forming system, and configured to separate an optical path of the illumination light and an optical path of the detected light via the reflective polarizer and the λ/4 plate, wherein the separation system includes at least one optical member arranged between the reflective polarizer and the λ/4 plate, the at least one optical member includes a flat surface and the illumination light transmitted through the flat surface of the at least one optical member illuminates the object to be detected, and the detected light transmitted through the flat surface of the at least one optical member forms the image on the photoelectric conversion device, at least one of the illumination system and the image forming system includes a polarizer, the polarizer is arranged on a plane shifted from a plane optically conjugate to the object to be detected, and a reflectance of S-polarized light is higher than a reflectance of P-polarized light in the reflective polarizer, the reflectance of P-polarized light in the reflective polarizer is not zero.

* * * * *